United States Patent
Akari et al.

(10) Patent No.: US 12,410,033 B2
(45) Date of Patent: Sep. 9, 2025

(54) SHEET FEEDING DEVICE AND PRINTING APPARATUS

(71) Applicant: CANON KABUSHIKI KAISHA, Tokyo (JP)

(72) Inventors: Shunsuke Akari, Kanagawa (JP); Noboru Hada, Kanagawa (JP); Yuki Igarashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 309 days.

(21) Appl. No.: 17/984,648

(22) Filed: Nov. 10, 2022

(65) Prior Publication Data

US 2023/0145298 A1 May 11, 2023

(30) Foreign Application Priority Data

Nov. 11, 2021 (JP) .................. 2021-184293

(51) Int. Cl.
*B65H 43/08* (2006.01)
*B65H 16/10* (2006.01)

(52) U.S. Cl.
CPC ............. *B65H 43/08* (2013.01); *B65H 16/10* (2013.01); *B65H 2553/414* (2013.01); *B65H 2557/61* (2013.01)

(58) Field of Classification Search
CPC ........ B65H 43/00; B65H 43/02; B65H 43/04; B65H 43/08; B65H 16/10; B65H 2513/11
See application file for complete search history.

(56) References Cited

U.S. PATENT DOCUMENTS

| | | | |
|---|---|---|---|
| 10,421,299 B2 | 9/2019 | Daikoku et al. | |
| 10,427,431 B2 | 10/2019 | Masuda et al. | |
| 10,597,247 B2 | 3/2020 | Eiyama et al. | |
| 10,703,117 B2 | 7/2020 | Elyama et al. | |
| 10,766,279 B2 | 9/2020 | Yasuda et al. | |
| 10,829,329 B2 | 11/2020 | Suzuki et al. | |
| 2016/0137448 A1* | 5/2016 | Sumioka | B65H 16/103 226/11 |
| 2018/0257405 A1* | 9/2018 | Masuda | B65H 5/28 |

FOREIGN PATENT DOCUMENTS

JP 2018-150106 A 9/2018

* cited by examiner

*Primary Examiner* — Sang K Kim

(74) *Attorney, Agent, or Firm* — Venable LLP

(57) ABSTRACT

A sheet feeding device includes a drive unit that rotates a roll of a wound sheet in a first direction and in a second direction, a sensor having an output which changes according to a distance between a detecting position facing a peripheral surface of the roll and the peripheral surface of the roll, and a control unit that determines an amplification factor of the sensor on the basis of data. The data is acquired by changing the amplification factor while the roll is rotated once in the second direction and includes a plurality of the output values acquired at different rotation angles.

10 Claims, 16 Drawing Sheets

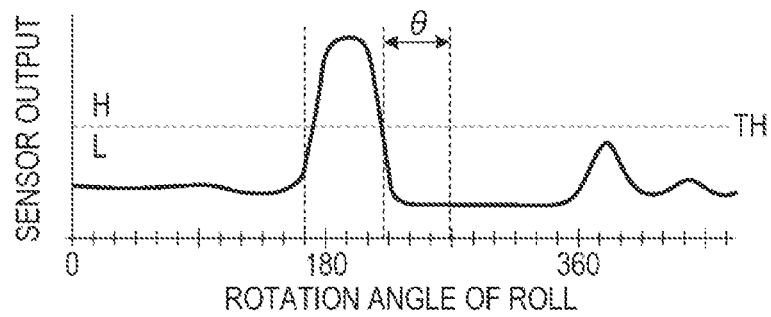
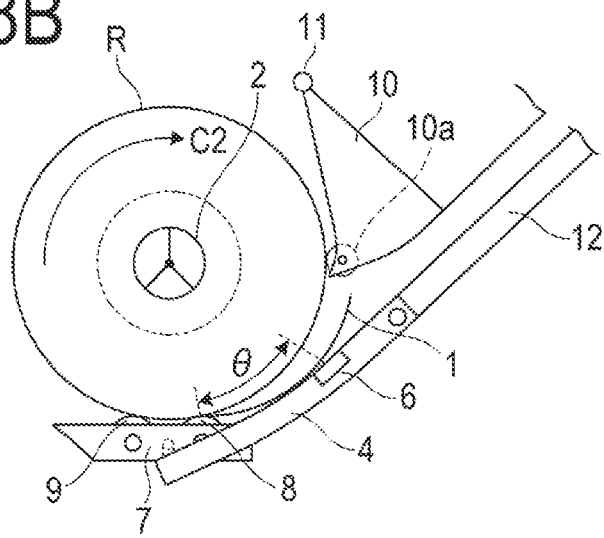
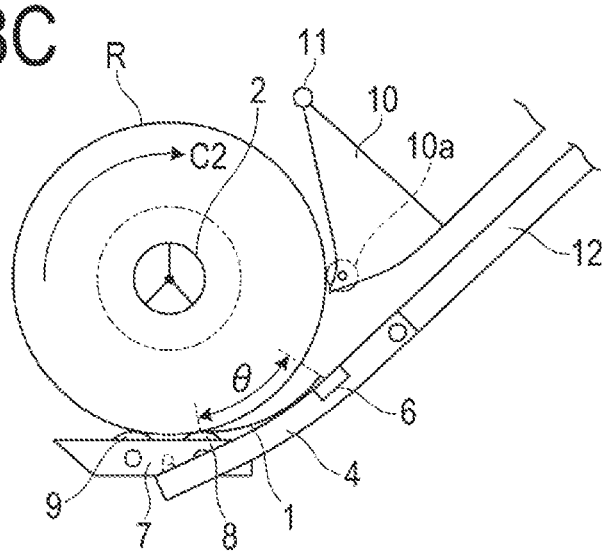

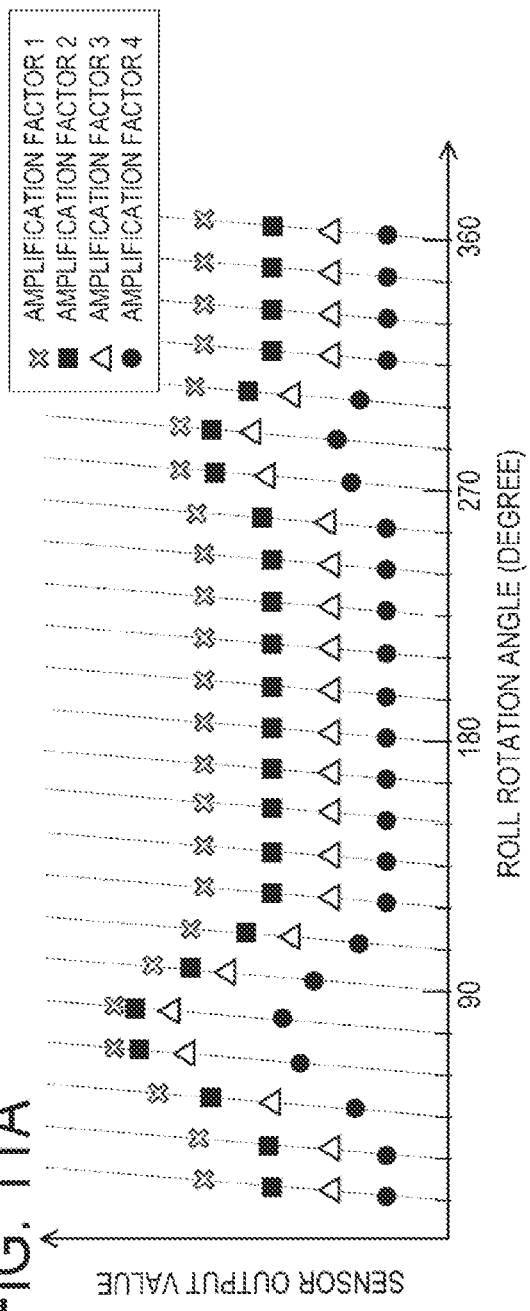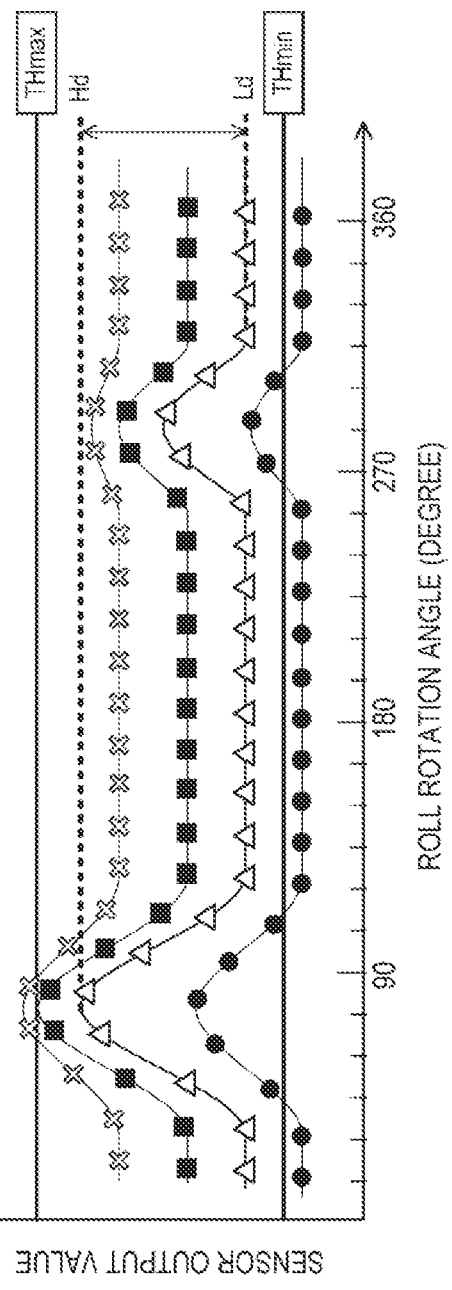

FIG. 16

MEMORY REGION

| ROLL NAME | AMPLIFICATION FACTOR OF SENSOR | NUMBER OF SETTINGS |
|---|---|---|
| ROLL NAME 1 | AMPLIFICATION FACTOR 1 | NUMBER OF SETTINGS 1 |
| ROLL NAME 2 | AMPLIFICATION FACTOR 2 | NUMBER OF SETTINGS 2 |
| ROLL NAME 3 | AMPLIFICATION FACTOR 3 | NUMBER OF SETTINGS 3 |
| ⋮ | ⋮ | ⋮ |
| ROLL NAME N | AMPLIFICATION FACTOR N | NUMBER OF SETTINGS N |

SHEET FEEDING DEVICE AND PRINTING APPARATUS

BACKGROUND OF THE INVENTION

Field of the Invention

The present invention relates to a sheet feeding device that pulls a sheet out of a roll of a wound continuous sheet to feed the sheet and relates to a printing apparatus.

Description of the Related Art

Japanese Patent Application Publication No. 2018-150106 discloses a printing apparatus that can detect a leading end of a sheet of a roll attached thereto and automatically feed out the sheet leading end. In this apparatus, the roll is rotated in a winding direction opposite to a feeding direction, and an optical sensor disposed in the vicinity of the roll detects sheet peeling and separation of the sheet leading end, under its own weight, from the roll.

SUMMARY OF THE INVENTION

In a sheet feeding device included in the printing apparatus described in Japanese Patent Application Publication No. 2018-150106, when a rolled sheet is replaced, to allow the leading end having peeled off from the roll to be detected by the optical sensor, it is required to adjust the sensor by changing an amount of light on a light emission side of the sensor or a sensitivity on a light reception side thereof such that a predetermined sensor waveform is output. In the adjustment of the sensor, it is necessary to change an amplification value of the light-emission-side light amount or the light-reception-side sensitivity, rotate the rolled sheet two or more times in the winding direction every time the amplification value is changed, and continuously repeat the rotating operation until a sensor output has a predetermined waveform. As a result, the sensor adjustment may take a longer time.

The present invention has thus been made in view of the problem described above, and an object thereof is to reduce a sensor adjustment time.

To attain the object described above, a sheet feeding device in the present invention includes:
  a drive unit that rotates a roll formed of a wound sheet in a first direction in which the sheet is fed out into a conveyance path and in a second direction which is reverse to the first direction;
  a sensor that outputs an output value according to a distance between a detecting position facing a peripheral surface of the roll and the peripheral surface of the roll; and
  a control unit that determines an amplification factor of the sensor on the basis of data,
    wherein the data is acquired by changing the amplification factor while the roll is rotated once in the second direction and includes a plurality of the output value acquired at different rotation angles.

To attain the object described above, a printing apparatus in the present invention includes:
  the above mentioned sheet feeding device; and
  a printing portion that prints an image on a sheet fed from the sheet feeding device.

By rotating a rolled sheet once, it is possible to adjust the sensor irrespective of a remaining amount of the rolled sheet and a type thereof, and therefore it is possible to reduce time required to adjust the optical sensor that detects sheet peeling.

Further features of the present invention will become apparent from the following description of exemplary embodiments with reference to the attached drawings.

BRIEF DESCRIPTION OF THE DRAWINGS

FIGS. 8A to 8C are illustrative views of a variation of a sensor output of the sensor unit;

FIGS. 11A and 11B are illustrative views of the sensor outputs at each of the sensor amplification factors in the first embodiment;

FIG. 16 is an illustrative view of a memory space in which a roll setting history is to be stored.

DESCRIPTION OF THE EMBODIMENTS

Figure 1:
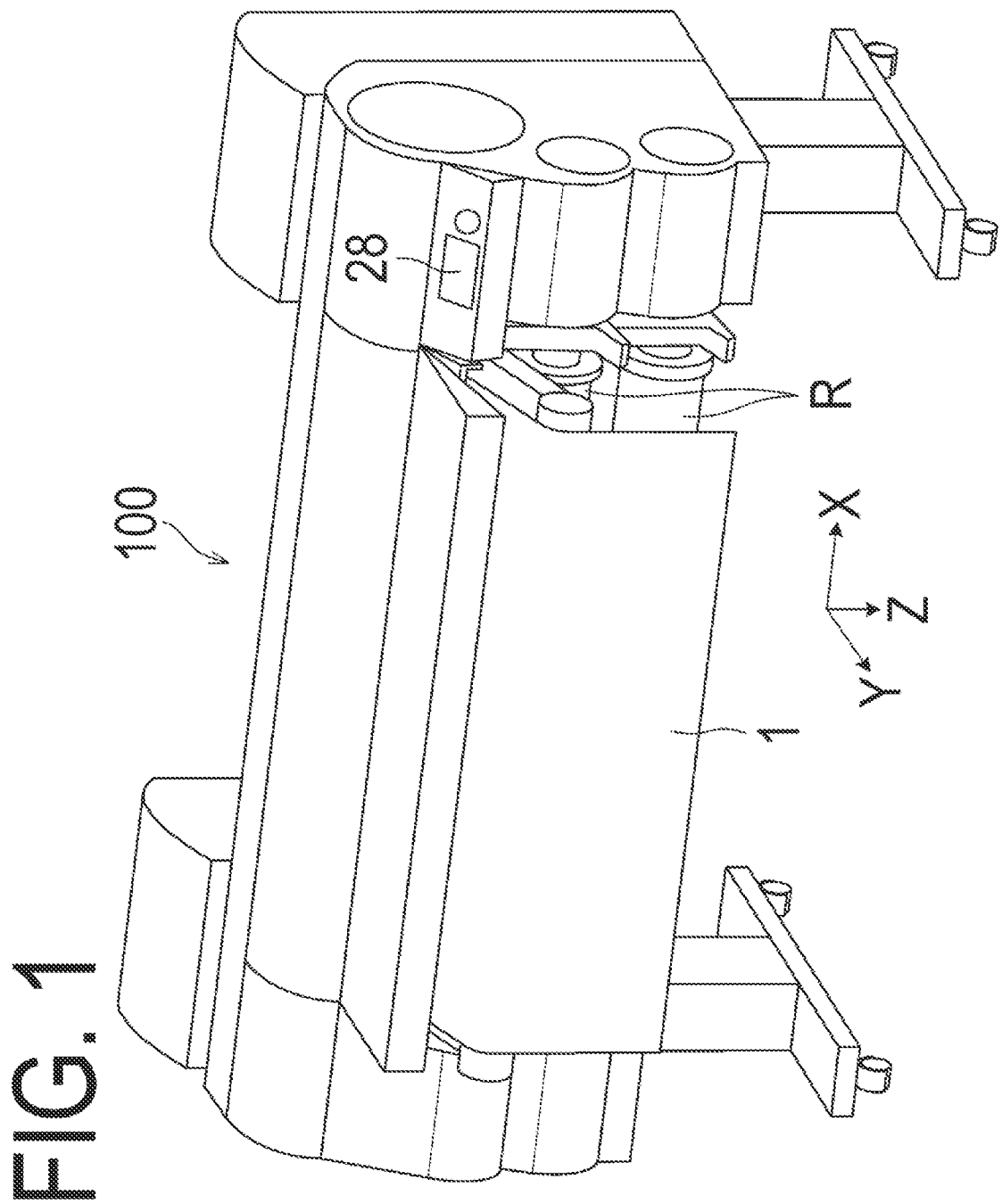
FIG. 1 is a perspective view of a printing apparatus in each of embodiments of the present invention.

Referring to the drawings, forms for carrying out the present invention will be described in detail by way of example on the basis of an embodiment example. Note that dimensions, materials, shapes, relative positioning, and the like of components described in each of embodiments are to be appropriately changed in accordance with configurations of an apparatus and a device to which the invention is applied and various conditions, and are therefore not intended to limit the scope of the invention to the following embodiments.

The following will describe each of the embodiments with reference to the drawings. First, a description will be given of a fundamental configuration of the present invention.

Fundamental Configuration

FIGS. 1 to 4 are illustrative views of a fundamental configuration of a printing apparatus as the embodiment example of the present invention. The printing apparatus in the present embodiment is an inkjet printing apparatus including sheet feeding devices each for feeding a sheet as a print medium and a printing portion that prints an image on the sheet. Note that, for the sake of description, coordinate axes are set as illustrated in the figure. In other words, it is assumed that a sheet width direction of a roll R is an X-axis direction, a direction in which the sheet is conveyed in a printing portion 400 (described later) is a Y-axis direction, and a direction of gravity is a Z-axis direction.

As illustrated in FIG. 1, a printing apparatus 100 in the present embodiment is configured such that the roll R (rolled sheet) obtained by winding a sheet 1, which is an elongated continuous sheet (referred to also as a web), into the form of a roll can be set in each of two upper and lower roll holding portions. On the sheet 1 selectively pulled out of the rolls R, an image is printed. Using various switches included in an operation panel 28 or the like, a user can input various commands, such as a command to specify a size of the sheet 1 and a command for online/offline switching, and the like to the printing apparatus 100.

Figure 2:
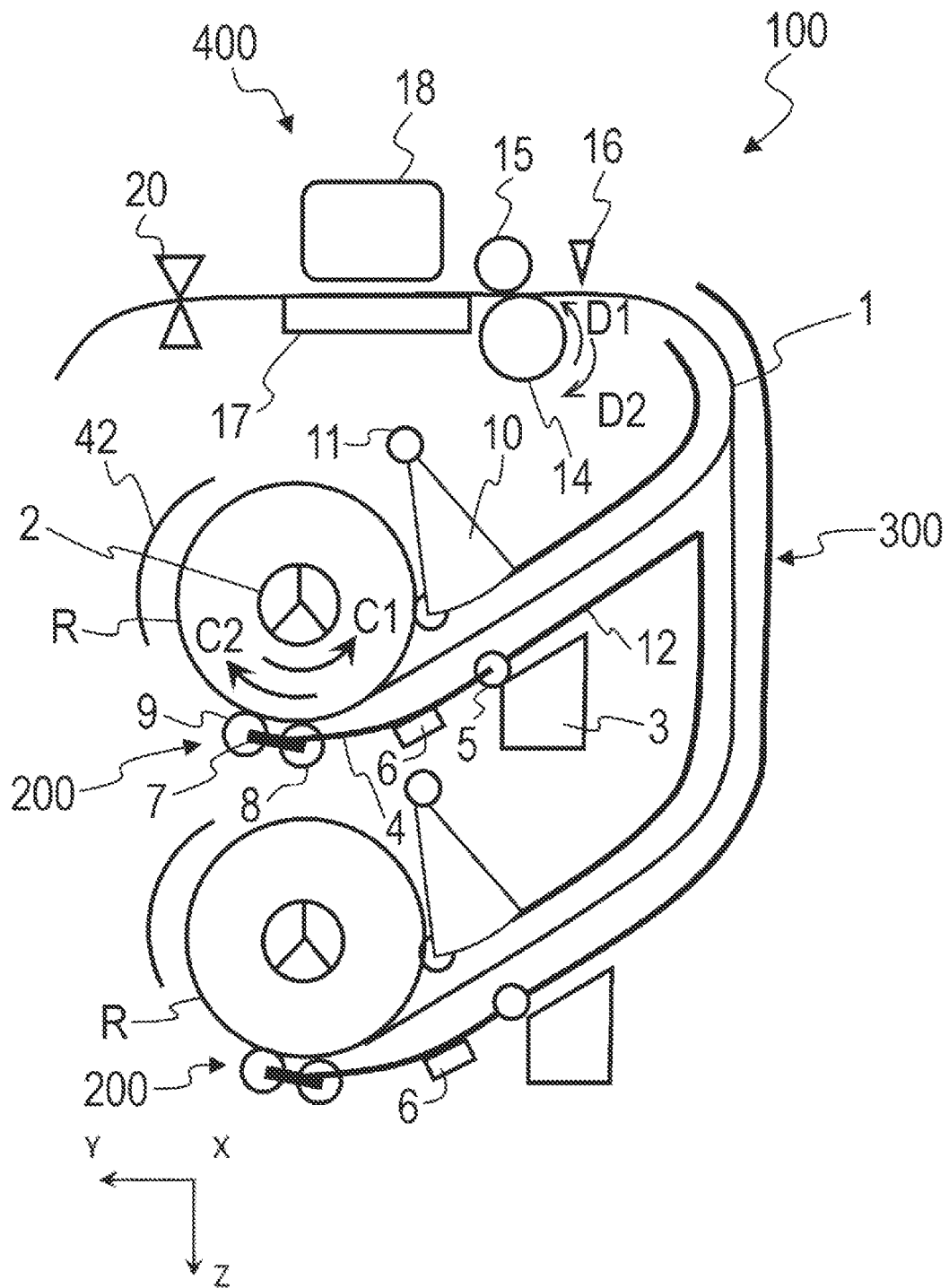
FIG. 2 is an illustrative view of the printing apparatus.

FIG. 2 is a schematic cross-sectional view of a principal portion of the printing apparatus 100. Two sheet feeding devices 200 (hereinafter referred to as the feeding devices) corresponding to the two rolls R are arranged one above the other. The sheet 1 pulled out of the roll R by each of the feeding devices 200 is conveyed by a sheet conveyance portion (conveyance mechanism) 300 along a sheet conveyance path to the printing portion 400 capable of printing an image. The printing portion 400 causes an ink jet type print head 18 to eject ink to print the image on the sheet 1. The print head 18 uses an ejection energy generating element such as an electro-thermal conversion element (heater) or a piezoelectric element to cause the ink to be ejected from an ejection port. The print head 18 is not limited only to an inkjet method, and a printing method for the printing portion 400 is also not limited. For example, a serial scanning method, a full line method, or the like may also be used. In the case of the serial scanning method, image printing involving an operation of conveying the sheet 1 and scanning of the print head 18 in a direction crossing a direction of conveyance of the sheet 1 is performed. In the case of the full line method, image printing is performed using the elongated print head 18 extending in the direction crossing the direction of conveyance of the sheet 1, while the sheet 1 is continuously conveyed.

The rolls R are set in the roll holding portions of the feeding devices 200 in a state where spool members 2 are inserted in respective hollow hole portions thereof, and the spool members 2 are driven by a motor 33 (see FIG. 4) serving as a drive unit for driving the rolls to normally and reversely rotate. Each of the feeding devices 200 includes a drive portion 3, an arm member (moving body) 4, an arm rotation shaft 5, a sensor unit 6, a swinging member 7, driven rotating bodies (contact bodies) 8 and 9, a separation flapper (upper guiding body) 10, and a flapper rotation shaft 11.

A conveyance guide 12 leads the sheet 1 pulled out of either of the feeding devices 200 to the printing portion 400, while guiding top and back surfaces of the sheet 1. A conveyance roller 14 is normally and reversely rotated in an arrow D1 direction and in an arrow D2 direction by a conveyance roller drive motor 35 (see FIG. 4) (described later). A nip roller 15 is capable of driven rotation with the rotation of the conveyance roller 14 and can be brought closer to and further away from the conveyance roller 14 by a nipping force adjustment motor 37 (see FIG. 4), while having a nipping force adjustable thereby. A speed at which the sheet 1 is conveyed by the conveyance roller 14 is set higher than a speed at which the sheet 1 is pulled out by the rotation of either of the rolls R. Thus, it is possible to give a back tension to the sheet 1 and convey the sheet 1 under tension.

A platen 17 of the printing portion 400 restricts a position of the sheet 1, and a cutter 20 cuts the sheet 1 having the image printed thereon. Covers 42 for the rolls R prevent the sheet 1 with the printed image from returning to the feeding devices 200. Such an operation in the printing apparatus 100 is controlled by a CPU 201 (see FIG. 4) (described later). Note that the platen 17 is a platen including a negative-pressure or electrostatic attraction unit, which allows the sheet to be held to the platen and stably supported.

Figure 3A:
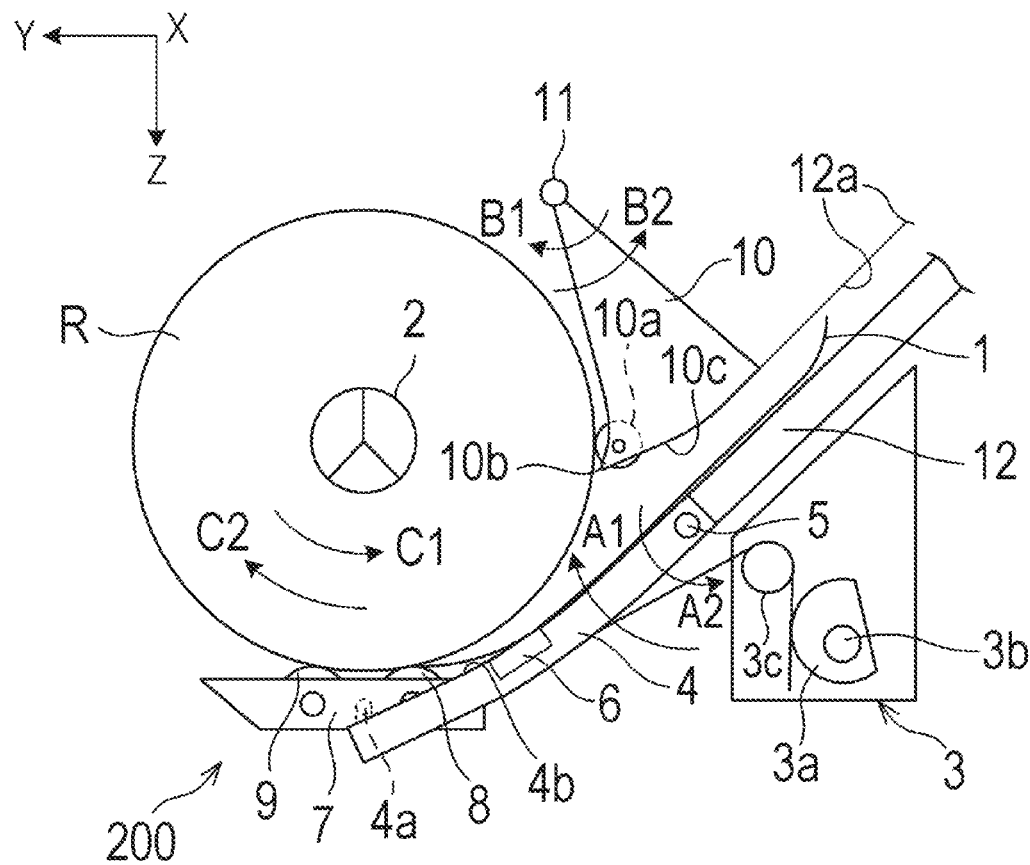
FIGS. 3A and 3B are illustrative views of each of arm members of sheet feeding devices.
Figure 3B:
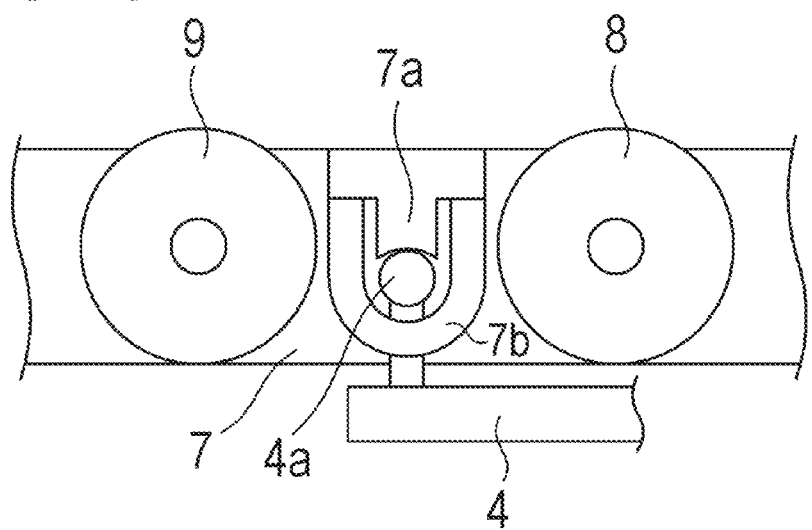

FIGS. 3A and 3B are illustrative views of the arm member 4 in each of the feeding devices 200 and, in the state in FIG. 3A, the roll R has a relatively larger outer diameter. To the conveyance guide 12, the arm member (moving body) 4 is attached via the arm rotation shaft 5 to be rotatable in an arrow A1 direction and in an arrow A2 direction. An upper portion of the arm member 4 is formed with a guiding portion 4b (lower guiding body) that guides a lower surface of the sheet 1 pulled out of the roll R. Between the arm member 4 and a rotation cam 3a of the drive portion 3, a torsion coil spring 3c that presses the arm member 4 in the arrow A1 direction is interposed. The rotation cam 3a is rotated by a pressing force adjustment motor 34 (see FIG. 4) (described later) and, depending on a rotation position thereof, a force with which the torsion coil spring 3c presses the arm member 4 in the arrow A1 direction varies. When a leading end portion of the sheet 1 (a part of the sheet 1 including a leading end) is to be set into a sheet feeding path through between the arm member 4 and the separation flapper 10, depending on the rotation position of the rotation cam 3a, the force with which the torsion coil spring 3c presses the arm member 4 is switched to three levels. In other words, the pressing force is switched to a pressing state with a relatively small force (weak-nip pressing force), to a pressing state with a relatively large force (strong-nip pressing force), and to a state where the pressing force is released.

To the arm member 4, the swinging member 7 is attached to be swingable. To the swinging member 7, the first and second driven rotating bodies (rotating bodies) 8 and 9 displaced from each other in a circumferential direction of the roll R are attached to be rotatable. These driven rotating bodies 8 and 9 move along an outer shape of the roll R to press-contact with an outer peripheral portion of the roll R from below in the direction of gravity under the pressing force in the arrow A1 direction against the arm member 4. In other words, the driven rotating bodies 8 and 9 press-contact with the outer peripheral portion of the roll R from positions below a horizontal center axis of the roll R in the direction of gravity. Press-contact forces thereof are changed depending on the pressing force with which the arm member 4 is pressed in the arrow A1 direction.

The plurality of arm members 4 each having the swinging member 7 are provided to be at different positions in the X-axis direction. As illustrated in FIG. 3B, the swinging member 7 is provided with a bearing portion 7a and a shaft fastening portion 7b. These portions allow a rotation shaft 4a of each of the arm members 4 to be received with predetermined backlash.

The bearing portion 7a is provided at a gravity center position of the swinging member 7 and supported by the rotation shaft 4a such that the swinging member 7 is in a stable posture in each of the X-axis direction, the Y-axis direction, and the Z-axis direction. In addition, since the rotation shaft 4a is received with the backlash, the swinging member 7 at any position in the X-axis direction is displaced by the pressing force in the arrow A1 direction against the arm member 4 so as to extend along the outer peripheral portion of the roll R. Such a configuration (equalize mechanism) tolerates changes in postures of the first and second driven rotating bodies 8 and 9 press-contacting with the outer peripheral portion of the roll R. As a result, contact areas between the sheet 1 and the first and second driven rotating bodies 8 and 9 are held to be constantly maximized, and the pressing force against the sheet 1 is equalized to be able to suppress variations in a force to convey the sheet 1. The driven rotating bodies 8 and 9 press-contacting with the outer peripheral portion of the roll R prevent the sheet 1 from being slackened and enhance the force to convey the sheet 1.

To a main body (printer main body) of the printing apparatus 100, the separation flapper 10 located above the arm member 4 is attached to be rotatable around the flapper rotation shaft 11 in an arrow B1 direction and in an arrow B2 direction. The separation flapper 10 is configured to contact, under its own weight, with an outer peripheral surface of the roll R and lightly press the outer peripheral surface. When it is necessary to more strongly press the roll R, a biasing force from a biasing member such as spring may also be used. In a portion of the separation flapper 10 in contact with the roll R, a driven roller 10a is rotatably provided so as to suppress an effect exerted by the pressing force on the sheet 1. In addition, a separation portion 10b at a leading end of the separation flapper 10 is formed to extend to a position as close as possible to the surface of the roll R so as to allow easy separation of the leading end portion of the sheet from the roll R.

The sheet 1 is pulled out of the roll R, while passing over the driven rotating bodies 8 and 9, to have the lower surface thereof guided by the guiding portion 4b in the upper portion of the arm member 4, and is then fed through the feeding path formed between the separation flapper 10 and the arm member 4. Thus, the driven rotating bodies 8 and 9 are caused to press-contact with the outer peripheral portion of the roll R from below, and the lower surface of the sheet 1 pulled out, while passing over the driven rotating bodies 8 and 9, is guided by the guiding portion 4b. This allows the sheet 1 to be smoothly fed by using the weight of the sheet 1. Moreover, the driven rotating bodies 8 and 9 and the guiding portion 4b move according to the outer diameter of the roll R to allow the sheet 1 to be reliably pulled out of the roll R irrespective of the outer diameter of the roll R.

One of features of the apparatus in the present embodiment is an automatic sheet loading function (automatic paper feeding function). In automatic loading, when the user sets an unused roll R in the apparatus, the apparatus detects a leading end of a sheet, while rotating the roll R in a direction (an arrow C2 direction in FIG. 3A, which is referred to as a reverse direction or a second direction) reverse to that during sheet feeding (during paper feeding). Then, the apparatus rotates the roll R in the rotation direction (an arrow C1 direction in FIG. 3A, which is referred to as a forward direction or a first direction) during the sheet feeding to automatically feed out the leading end portion of the sheet separated from the roll R. The sensor unit 6 is a unit including a leading end sensor that detects sheet peeling (sheet separation) which is peeling of the leading end portion of the sheet 1 from the outer peripheral surface of the roll R. The leading end portion of the sheet 1 detected by the sensor unit 6 is automatically inserted into the sheet feeding path between the arm member 4 and the separation flapper 10. Then, a sheet feeding operation of feeding out the sheet 1 into the conveyance path is performed. A more detailed procedure of the automatic loading function will be described later.

The printing apparatus 100 in the present embodiment includes the two upper and lower feeding devices 200 to be capable of switching from a state where the sheet 1 is fed from one of the feeding devices 200 to a state where the sheet 1 is fed from another of the feeding devices 200. In such a case, the one feeding device 200 winds back the sheet 1 that has been fed thus far to the roll R. The leading end of the sheet 1 is retracted to a position at which the leading end of the sheet 1 is sensed by the sensor unit 6 or another sheet end portion sensor provided in the vicinity of the sensor unit 6.

Figure 4:
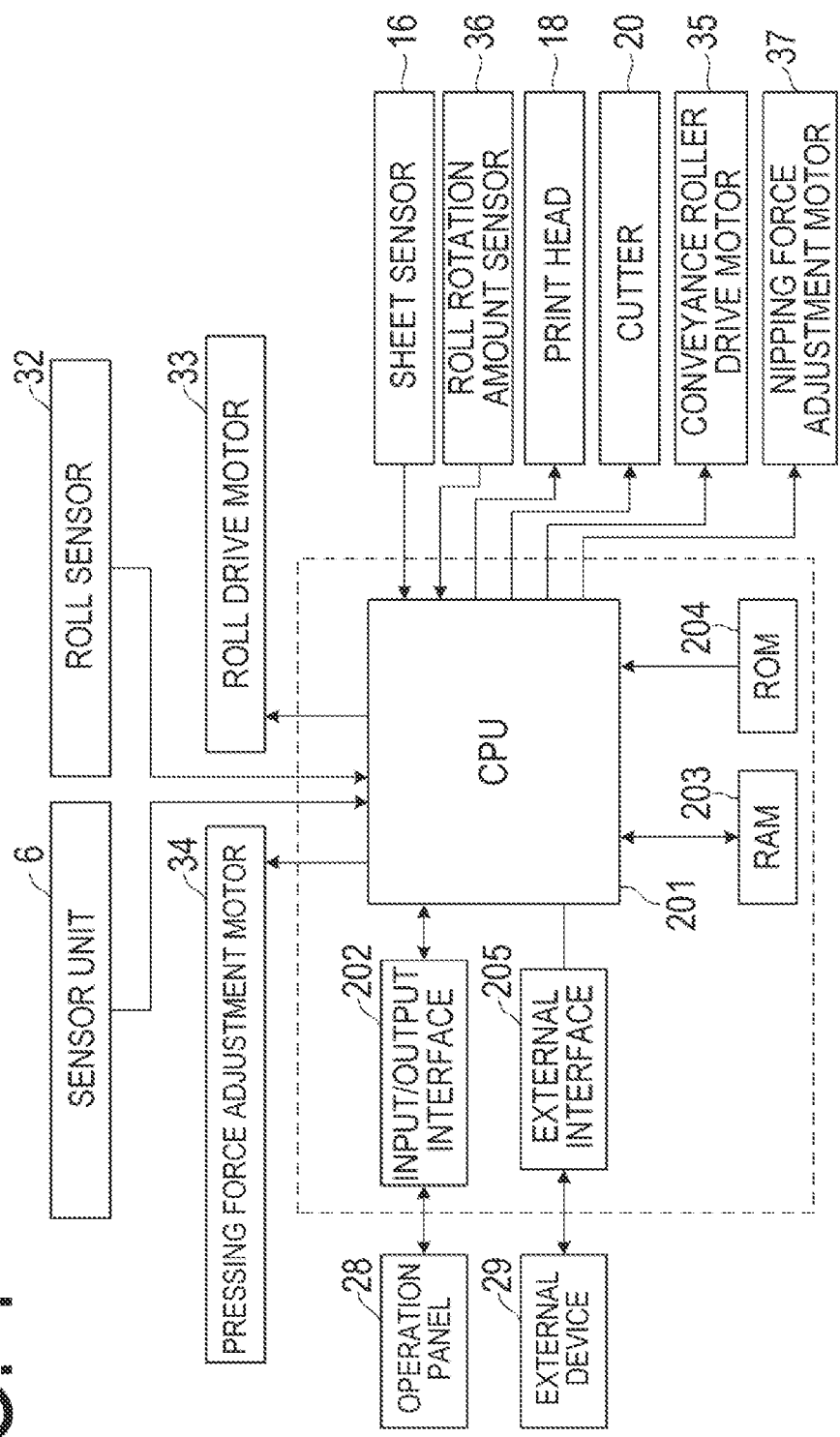
FIG. 4 is a block diagram for illustrating a control system of the printing apparatus.

FIG. 4 is a block diagram for illustrating an example of a configuration of a control system in the printing apparatus 100. The CPU 201 of the printing apparatus 100 controls the individual portions of the printing apparatus 100 including the feeding devices 200, a sheet conveyance portion 300, and the printing portion 400 according to a control program stored in a ROM 204. To the CPU 201, a type of the sheet 1, a width thereof, various setting information, and the like are input from the operation panel 28 via an input/output interface 202. The CPU 201 is connected to various external devices 29 including a host device such as a personal computer via an external interface 205 to give and receive various information such as print data to and from the external devices 29. The CPU 201 also writes and reads information related to the sheet 1 or the like to and from a RAM 203. That is, the CPU 201 corresponds to a control unit of the feeding device 200 in the present invention. The motor 33 is a roll drive motor for normally and reversely rotating the rolls R via the spool members 2, which is included in a drive mechanism (rotation mechanism) capable of drive-rotating the rolls R. The pressing force adjustment motor 34 is a motor that rotates the rotation cam 3a so as to adjust the pressing force against the arm member 4. The conveyance roller drive motor 35 is a motor for normally and reversely rotating the conveyance roller 14. A roll sensor 32 is a sensor for detecting the spool member 2 of the roll R when the roll R is set in either of the feeding devices 200. A roll rotation amount sensor 36 is a sensor (rotation angle detection sensor) for detecting an amount of rotation of the spool member 2, i.e., the roll R, which is, e.g., a rotary encoder that outputs the number of pulses according to the amount of rotation of the roll R.

Sheet Feeding Preparation Processing

Figure 5:
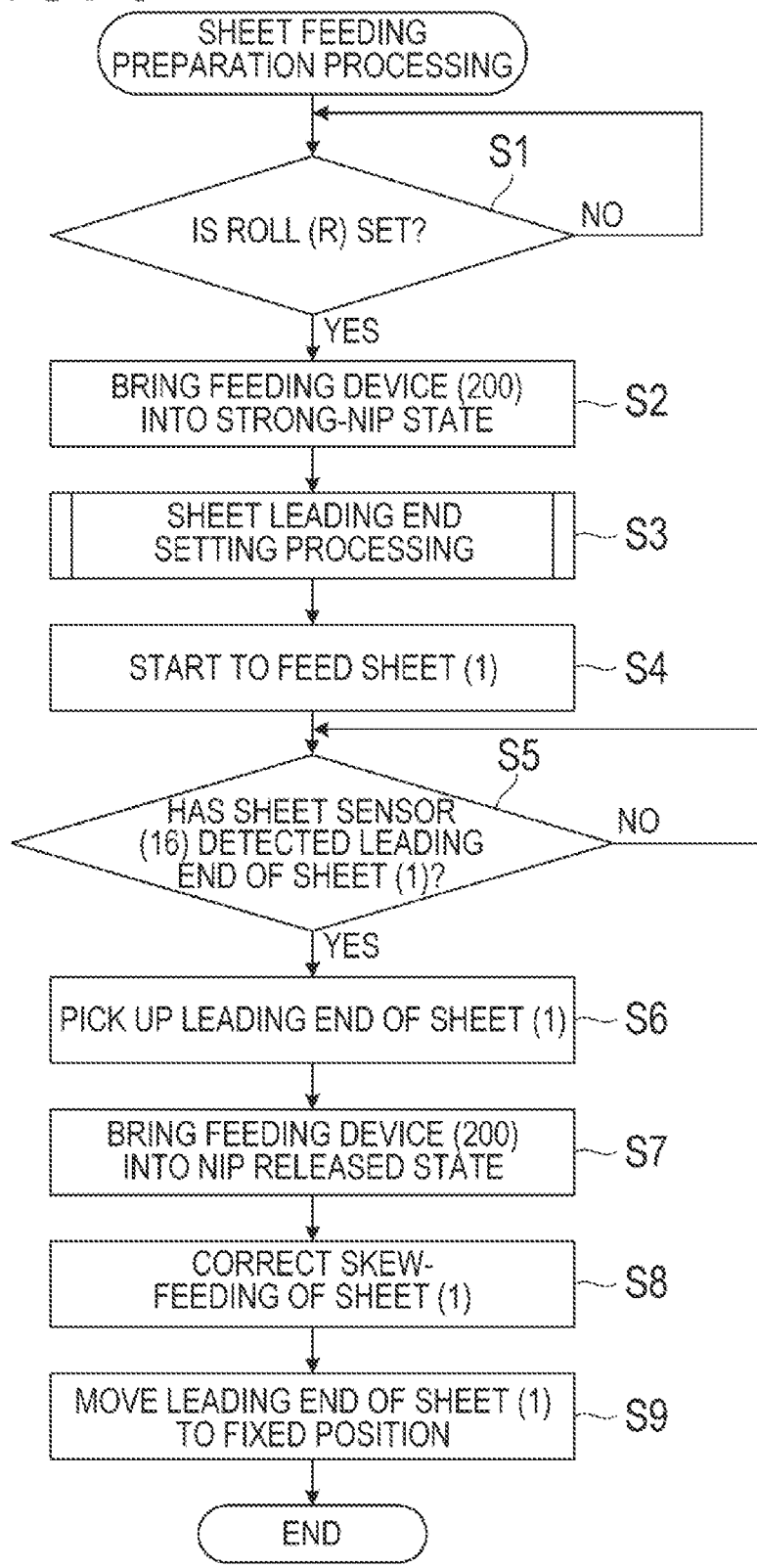
FIG. 5 is a flow chart of sheet feeding preparation processing.

FIG. 5 is a flow chart for illustrating feeding preparation processing for the sheet 1 beginning with the setting of the roll R.

The CPU 201 of the printing apparatus 100 is on standby in a state (weak-nip state) where each of the arm members 4 is pressed in the arrow A1 direction with the "weak-nip pressing force", and first determines whether or not the roll R is set (Step S1). In the present embodiment, it is determined when the roll sensor 32 detects the spool member 2 of the roll R that the roll R is set. After the roll R is set, the CPU 201 switches the arm member 4 to a state (strong-nip state) where the arm member 4 is pressed in the arrow A1 direction with the "strong-nip pressing force" (Step S2). Then, the CPU 201 executes sheet leading end setting processing of setting the leading end portion of the sheet 1 into the sheet feeding path through between the arm member 4 and the separation flapper 10 (Step S3). By the sheet leading end setting processing (automatic loading), the leading end portion of the sheet 1 is set (inserted) into the sheet feeding path. Details of the sheet leading end setting processing will be described later.

Then, the CPU 201 causes the roll drive motor 33 to rotate the roll R in the arrow C1 direction to start to feed the sheet 1 (Step S4). When the leading end of the sheet 1 is detected by the sensor unit 6 (Step S5), the CPU 201 normally rotates the conveyance roller 14 in the arrow D1 direction to pick up the leading end of the sheet 1, and then stops the motor 33 and the motor 35 (Step S6). Then, the CPU 201 releases the pressing force pressing the arm member 4 in the arrow A1 direction to separate the first and second driven rotating bodies 8 and 9 from the roll R (nip released state) (Step S7). Then, the CPU 201 determines whether or not the sheet was conveyed while being obliquely tilted (skew-fed) in the sheet conveyance portion 300. Specifically, in the sheet conveyance portion 300, a predetermined amount of the sheet 1 is conveyed, and an amount of skew feeding occurring at that time is detected by using a sensor provided in a carriage in which the print head 18 is mounted or in the sheet conveyance portion 300. When the skew feeding amount is larger than a predetermined allowable amount, feeding and back-feeding of the sheet 1 is repeated with the normal rotation and the reverse rotation of the conveyance roller 14 and the roll R, while a back tension is given to the sheet 1. By such an operation, the skew-feeding of the sheet 1 is corrected (Step S8). By thus brining the feeding devices 200 into the nip released state during the correction of the skew feeding of the sheet 1 and during an operation of printing an image onto the sheet 1, it is possible to avoid the effect exerted by the driven rotating bodies 8 and 9 on accuracy of the correction of the skew feeding of the sheet 1 and on accuracy of the image printing. Then, the CPU 201 causes the sheet conveyance portion 300 to move the leading end of the sheet 1 to a standby position (fixed position) in the printing portion 400 before printing was started (Step S9). Thus, the preparation of the feeding of the sheet 1 is completed. Then, the sheet 1 is pulled out of the roll R with the rotation of the roll R and conveyed by the sheet conveyance portion 300 to the printing portion 400.

A description will be given of the sheet leading end setting processing (Step S20) in FIG. 5 in the fundamental configuration of the printing apparatus 100.

As the sensor unit 6, an optical sensor having an output changing according to a facing distance to the surface (outer surface) of the sheet 1 is used. Then, after it is detected that the leading end portion of the sheet 1 has peeled off and separated (peeling) from the outer peripheral surface of the roll R on the basis of a change in the output of the sensor unit 6 during the rotation of the roll R in the reverse direction (the arrow C2 direction), the roll R is rotated in the arrow C1 forward direction to feed the sheet 1.

Figure 6:
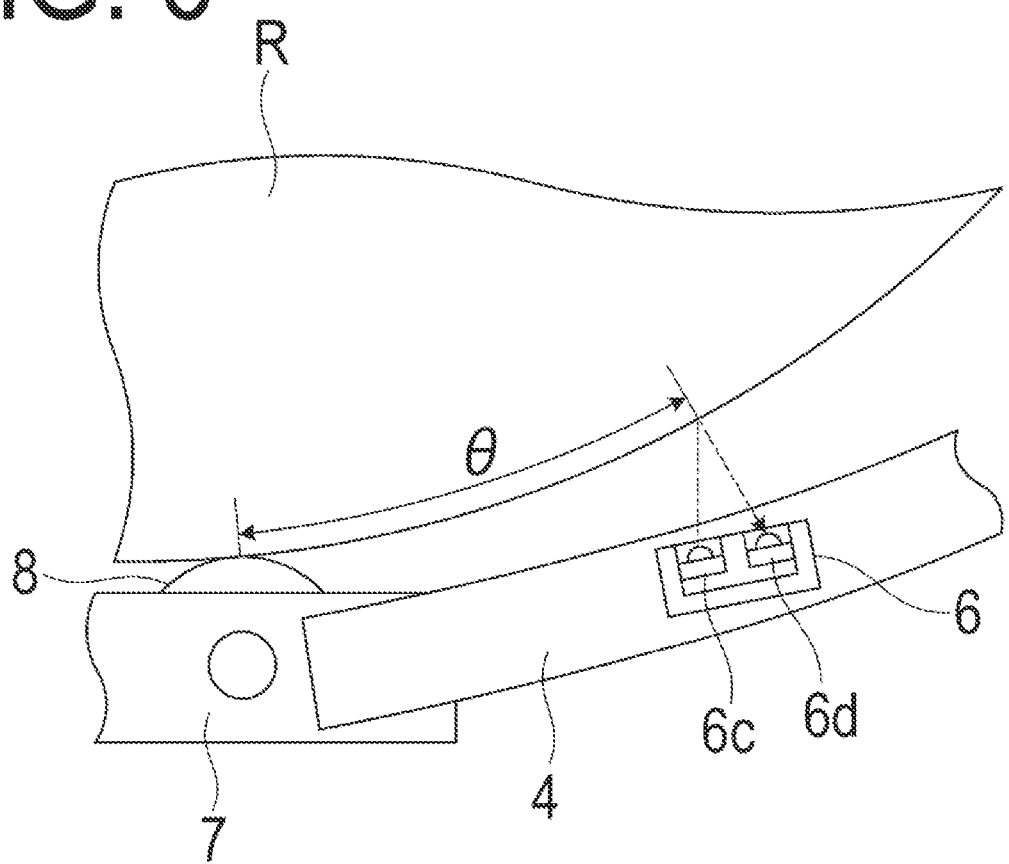
FIG. 6 is an illustrative view of a sensor unit.
Figure 7:
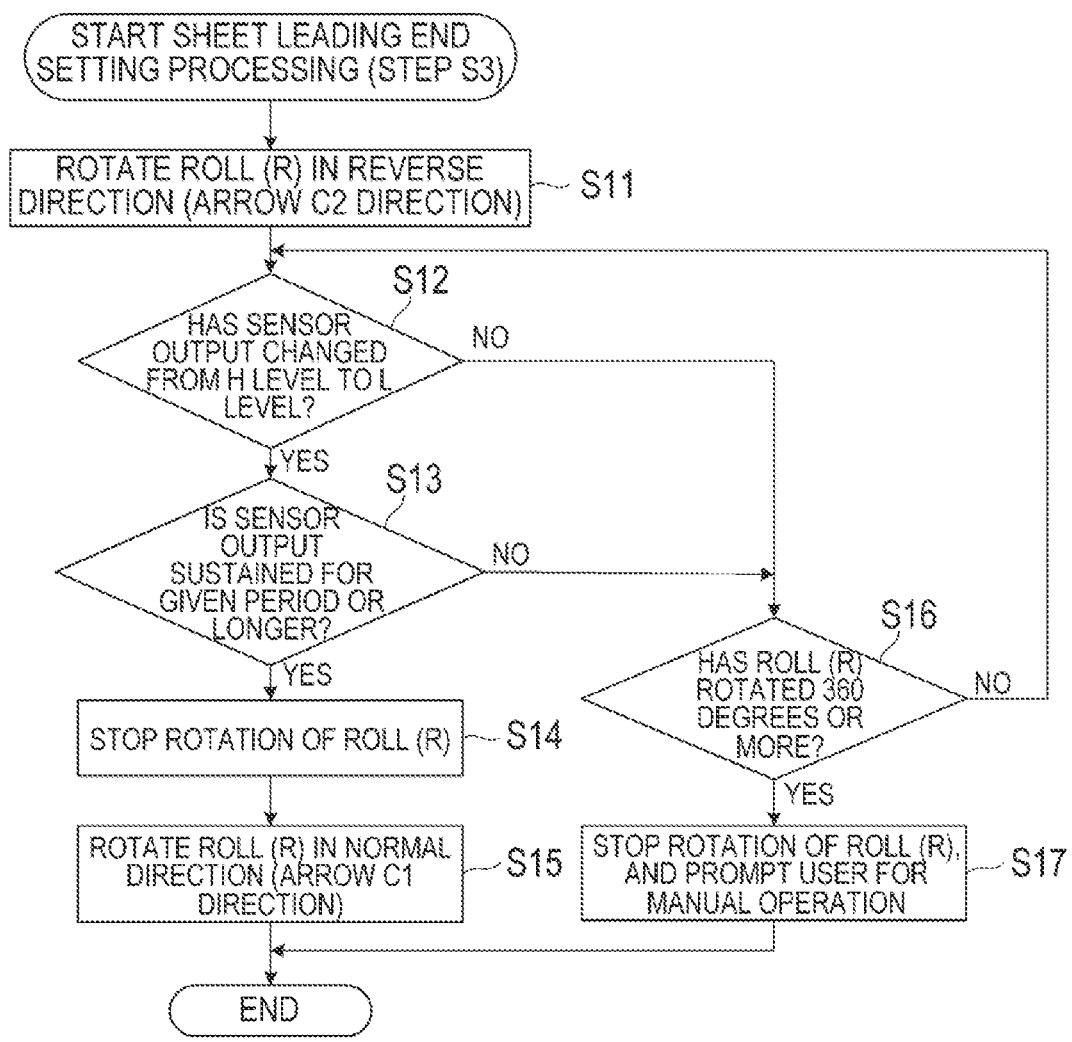
FIG. 7 is a flow chart for illustrating sheet leading end setting processing.

As illustrated in FIG. 6, in the sensor unit 6 in the present embodiment, a light emitting portion 6c such as an LED and a light receiving portion 6d such as a photodiode are embedded. The light emitting portion 6c is configured to emit detecting light toward the outer peripheral surface of the roll R, while the light receiving portion 6d is configured to receive the detecting light reflected by the outer peripheral surface of the roll R and the detecting light reflected by a portion of the sheet 1 peeled off from the roll R. The light emitted from the light emitting portion 6c toward the roll R is reflected by the surface of the sheet 1 in the roll R and then detected by the light receiving portion 6d. The light emitted from the light emitting portion 6c and detected by the light receiving portion 6d includes regularly reflected light reflected from the surface of the sheet 1 in the roll R. An output value from the light receiving portion 6d changes according to a facing gap (distance) between the sensor unit 6 provided at a detecting position facing the outer peripheral surface of the roll R and a downwardly facing surface of the sheet 1 (surface corresponding to a sheet outer surface serving as the outer peripheral surface in the roll on which printing is to be performed by the printing portion). In other words, the output value from the light receiving portion 6d is larger as the distance (gap) between the sensor unit 6 and the surface of the sheet 1 is smaller, and is smaller as the distance (gap) is larger. When the sensor unit 6 is disposed at a position which is easily approachable by the leading end portion of the sheet 1 peeled off from the roll R and at which the output value from the light receiving portion 6d tends to be larger, a position of the leading end portion of the sheet 1 is easily acquirable from the output value. In addition, it is necessary to prevent the leading end portion of the sheet 1 from hanging down under its own weight in a gap between the driven rotating body 8 and the arm member 4 and affecting a nipped state of the sheet 1. Accordingly, the sensor unit 6 is provided between the driven rotating body 8 and the separation flapper 10 before the leading end portion of the sheet 1 is inserted into the sheet feeding path. Note that the sensor unit 6 may appropriately be configured such that the output value of a detection signal changes according to the distance between the sensor unit 6 and the surface of the sheet 1, and the light emitting portion 6c and the light receiving portion 6d are not limited only to the LED and the photodiode. The light detected by the light receiving portion 6d is also not limited only to the regularly reflected light. The sensor unit 6 is connected to the CPU 201 (see FIG. 4), and the CPU 201 acquires a detection result from the sensor unit 6 with optional timing.

FIGS. 7 and 8A to 8C are illustrative views of sheet leading end setting processing (Step S3 in FIG. 5) using the sensor unit 6. As described previously, the sheet leading end setting processing (automatic loading) is processing of automatically inserting, after the roll R is set, the leading end portion of the sheet 1 from the roll R into the sheet feeding path between the arm member 4 and the separation flapper 10 and feeding out the sheet 1 into the conveyance path with the sheet leading end in the lead. The arm member 4 faces the surface of the sheet 1 (sheet outer surface), while the separation flapper 10 faces the back surface of the sheet 1 (sheet inner surface).

Prior to the sheet leading end setting processing, the CPU 201 first determines whether or not the roll R is set (Step S1 in FIG. 5). In the present embodiment, when the roll sensor 32 detects the spool member 2 of the roll R, it is determined that the roll R is set. After the roll R is set, the CPU 201 switches the arm member 4 into the state (strong-nip state) where the arm member 4 is pressed in the arrow A1 direction by the "strong-nip pressing force" (Step S2 in FIG. 5).

In the subsequent sheet leading end setting processing (Step S3 in FIG. 5), the CPU 201 uses the sensor unit 6 to perform a sheet leading end detecting operation of acquiring the position of the sheet leading end peeled off from the outer peripheral surface of the roll R. First, the roll R is rotated (reversely rotated) in the arrow C2 direction (Step S11). Then, during the reverse rotation of the roll R, it is determined whether or not an output of a detecting signal (sensor signal level) from the sensor unit 6 has changed so as to fall from within an H level range (first level range) into an L level range (second level range) (Step S12). FIG. 8A is an illustrative view of an example of a waveform of the sensor output, and the rotation angle of the roll R at the start of the reverse rotation of the roll R is assumed to be 0 degrees. Normally, the sensor output is on an L level. When the roll R is reversely rotated 170 degrees, as the sheet outer surface of the leading end portion of the sheet 1 moves closer to the detecting position on the sensor unit 6 as in FIG. 8B, the sensor output rises (increases) from the L level to an H level, as in FIG. 8A. More specifically, when the roll R is reversely rotated 170 degrees, the leading end portion of the sheet 1 passes through a contact position of the driven roller 10a of the separation flapper 10. As a result, the leading end portion of the sheet 1 moves out of the contact position and starts to peel off from the roll outer peripheral surface to fall onto the arm member 4 under its own weight and under a return force of the flexed sheet. At this time, as in FIG. 8B, the sheet outer surface of the leading end portion of the sheet 1 moves so as to gradually approach the detecting position on the sensor unit 6. When the roll R is further reversely rotated 200 degrees, as in FIG. 8C, the sheet outer surface of the leading end portion of the sheet 1 passes through the detecting position on the sensor unit 6. As a result, intense reflected light from the sheet outer surface disappears, weak reflected light from the surface of the far away roll R is received, and the sensor output rapidly lowers (decreases) from the H level to the L level. Then, when the roll R is further reversely rotated by an angle θ, the leading end portion of the sheet 1 reaches the contact position of the driven rotating body 8.

The H level and the L level are obtained by dividing an output intensity of the sensor unit 6 into two levels. When the facing gap between the sensor unit 6 and the sheet 1 from the roll R is small, the H level is reached and, when the facing gap therebetween is large, the L level is reached. A threshold TH serving as a boundary separating these levels is set in advance and stored in a nonvolatile memory in the printer main body or in the sensor unit 6. The threshold TH is set on the basis of sensor outputs L0 and H0. In other words, the threshold TH is set on the basis of an intermediate value between a minimum level and a maximum level of the sensor output when the roll R is rotated one or more times (e.g., a plurality of times). For example, when it is assumed that the minimum-level sensor output is L0 and the maximum-level sensor output is H0, the threshold TH can be set as the intermediate value (TH=(H0+L0)/2) between these sensor outputs L0 and H0. Since the threshold TH varies due to variations in the sensor unit 6, it is desirable to measure the sensor outputs L0 and H0 for each of the individual sensor units 6 and set the threshold TH on the basis of a measurement value.

Thus, in correspondence to the movement of the outer surface of the sheet leading end portion peeled off from the roll R approaching the detecting position on the sensor, the sensor output rises. Then, in correspondence to the movement of the outer surface of the sheet leading end portion away from the detecting position on the sensor due to the rotation of the roll in the C2 direction, the sensor output drops. Through capturing of such changes (predetermined changes) in the sensor output by the CPU 201, it is possible to detect the peeling of the sheet 1 from the roll R. As a result, it is possible to precisely obtain timing with which the sheet peeled off from the roll reaches a guiding surface and the sheet peeling is completed. In control for the determination of the peeling of the sheet leading end from the roll R, the sensor unit 6 and the CPU 201 correspond to a peeling detecting unit in the present invention.

As in FIG. 8C, when the leading end portion of the sheet 1 passes through the sensor unit 6, the sensor output shifts from the H level to the L level and, when the L level of the sensor output is sustained for a given period thereafter, the rotation of the roll R is stopped (Steps S13 and S14). Specifically, it is determined whether or not the sensor output has sustained the L level in a given period during which, after the sensor output changed from the H level to the L level, the roll R is further reversely rotated only by a given angle A and, when the L level is sustained, the rotation of the roll R is stopped. The given angle A is an angle smaller than the angle θ, which is an angle (A=θ/2) half the angle θ in the case of the present embodiment. When the rotation of the roll R is stopped in Step S14, the leading end portion of the sheet 1 is located on the arm member 4 between the sensor unit 6 and the driven rotating body 8. Thus, on the basis of a result of the detecting by the sensor unit 6, the position of the sheet leading end can be acquired. As a result, by normally rotating the roll R in the arrow C1 direction thereafter (Step S15), it is possible to automatically insert the leading end portion of the sheet 1 into the sheet feeding path between the arm member 4 and the separation flapper 10 and feed out the leading end of the sheet 1 (automatic loading).

When the sensor output has not shifted from the H level to the L level even after the roll R was reversely rotated one more time (a predetermined amount of not less than 360 degrees), the processing moves from Step S16 to Step S17. When the sensor output has not sustained the L level for the given period even after the roll R was reversely rotated by the given amount of not less than one rotation also, the processing moves from Step S16 to Step S17. When the leading end portion of the sheet 1 has not separated from the outer peripheral surface of the roll R during one rotation of the roll R, defective peeling from the outer peripheral surface of the roll R can be considered. Meanwhile, when the leading end of the sheet 1 separated from the outer peripheral surface of the roll R has not separated from over the sensor unit 6 during one rotation of the roll R, it can be considered that the peeled sheet has caused a paper jam (jam) on the sensor. In either case, automatic paper feeding cannot be performed. In Step S17, the rotation of the roll R is stopped, the user is notified that the automatic loading (automatic paper feeding) could not be performed, and the user is prompted for a manual operation (manual paper feeding) for inserting the leading end portion of the sheet 1 into the sheet feeding path. When having inserted the sheet leading end portion, the user gives an instruction to feed paper to the apparatus. On the basis of this instruction, the roll R starts to be rotated in the normal direction to feed out the inserted sheet into the apparatus.

Thus, in the present embodiment, after the roll R is set, it is possible to automatically insert the leading end portion of the sheet 1 into the sheet feeding path and feed out the sheet 1. Consequently, after having set the roll R, the user need not manually insert the leading end portion of the sheet 1 into the sheet feeding path, which reduces work load when the roll R is set.

First Embodiment

FIGS. 9 to 11A and 11B are diagrams for illustrating the first embodiment of the present invention.

In the present embodiment, first, a variation (sub-data set) of the sensor output value during one rotation of the roll R obtained with a predetermined amplification factor is acquired for each of a plurality of sensor amplification factors, and an appropriate sub-data set is selected from among the plurality of sub-data sets to be used for rotation control during sheet conveyance. At that time, in the acquisition of the plurality of sub-data sets, (1) by varying the amplification factor during one rotation of the roll and obtaining the sensor output values, some of the sensor output values included in the sub-data sets are sporadically acquired as actual measurement values. (2) The remaining sensor output values included in the sub-data sets are acquired by calculation or the like on the basis of the sensor output values acquired as the actual measurement values. From the sensor output values thus obtained, the sub-data sets during one rotation of the roll with the individual amplification factors are acquired. (3) From among the plurality of the sub-data sets thus obtained, the appropriate sub-data set is selected to be used to determine the sensor amplification factor.

Figure 9:
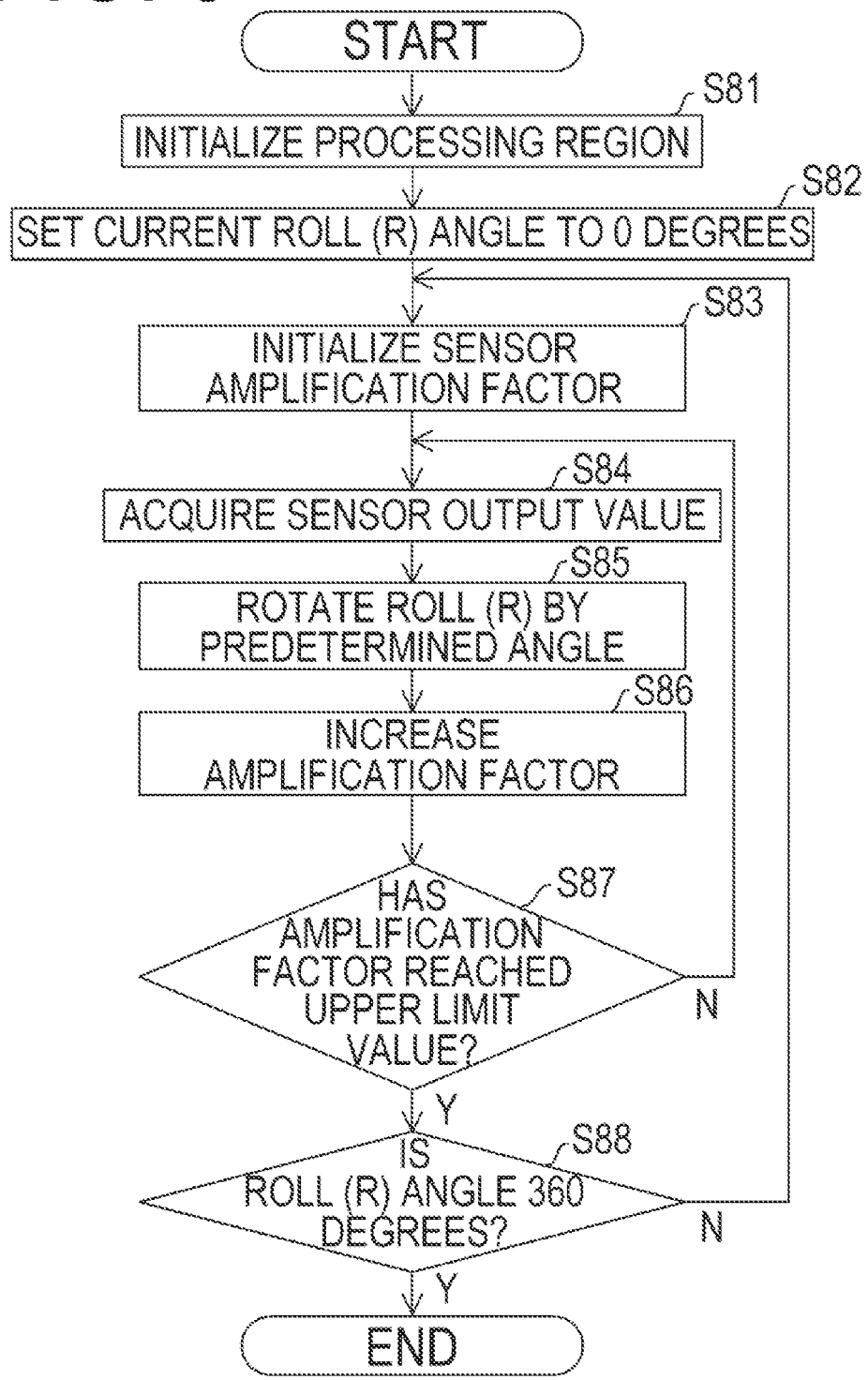
FIG. 9 is a flow chart of sensor output value acquirement processing in the first embodiment.

FIG. 9 is a flow chart illustrating the processing (1) described above to be performed by the CPU 201 so as to acquire the output values when the roll R is rotated once with the plurality of sensor amplification factors.

First, a data processing region is initialized to ensure a region for processing output data from the sensor unit 6 (Step S81), and a current rotation angle of the roll R is set to 0 degrees (Step S82). Then, the sensor amplification factor is set to an initial value stored in advance in the nonvolatile memory in the printer main body or in the sensor unit 6 (Step S83). Then, the output value after amplification with the sensor amplification factor is acquired and stored in an EEPROM 6g (Step S84), the roll R is rotated by a predetermined angle (Step S85), and the sensor amplification factor is increased (Step S86). Then, it is determined whether or not the increased sensor amplification factor has reached a prescribed upper limit value (Step S87), Steps S84 to Step S86 are repetitively performed until the sensor amplification factor reaches the upper limit value, and a plurality of the output values after the amplification with the plurality of individual amplification factors are acquired. Note that, increasing the sensor amplification factor may be increasing either one or both of an emission intensity of the light emitting portion 6c and a photosensitivity of the light receiving portion 6d. In addition, the initial value of the sensor amplification factor (Step S83), a degree to which the sensor amplification factor is increased (Step S86), and the upper limit value of the sensor amplification factor (Step S87) may also be set depending on types of media to be used, a use environment, or the like. When the sensor amplification factor has reached the upper limit value, it is determined whether or not an angle by which the roll R is rotated is 360 degrees, i.e., whether or not the roll R is rotated once (Step S88), and Steps S83 to Step S87 are repetitively performed until the angle of the roll R reaches 360 degrees. When the angle of the roll R reaches the 360 degrees, it is determined that the output value corresponding to one rotation when the roll R is rotated once is acquired as data for determining the amplification factor of the sensor, and the processing is ended. By thus sequentially changing the sensor amplification factor during one rotation of the roll R (from an amplification factor 4 to an amplification factor 3, to an amplification factor 2, to an amplification factor 1, to the amplification factor 4, to the amplification factor 3, and to . . . in an example in FIG. 11A), as data including the plurality of sensor output values when the roll R is rotated once, the sensor output values when the roll R is rotated once can be acquired at different rotation angles with the plurality of sensor amplification factors.

Next, as the processing (2) described above, on the basis of the sensor output values obtained in the flow chart in FIG. 9, the remaining sensor output values required to configure the sub-data sets described above are acquired by calculation or the like.

Figure 10:
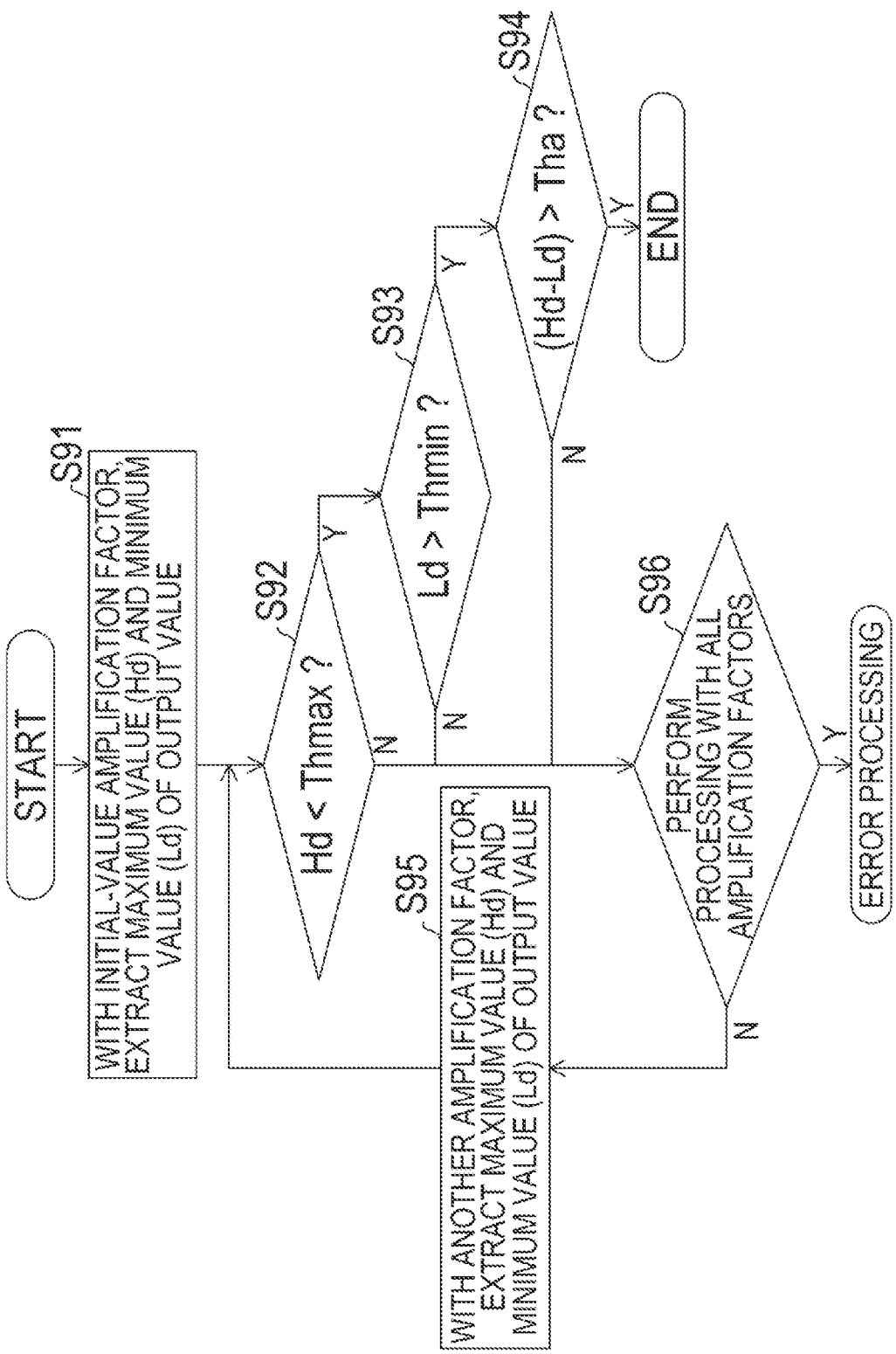
FIG. 10 is a flow chart for illustrating sensor amplification factor determination processing.

FIG. 10 is a flow chart illustrating the processing (3) described above to be performed by the CPU 201 so as to determine the appropriate sensor amplification factor on the basis of the output values acquired with the individual sensor amplification factors according to the flow chart in FIG. 9.

First, using the plurality of acquired sensor output values, the sub-data sets for determining the sensor amplification factor illustrated in FIG. 11B (described later) are produced and, from the sub-data sets, a maximum value Hd and a minimum value Ld among the output values after the amplification corresponding to the initial-value sensor amplification factor are extracted (Step S91). Then, it is determined whether or not the extracted maximum value Hd is smaller than an upper limit determination value THmax corresponding to a first threshold (Step S92). Then, it is determined whether or not the extracted minimum value Ld is larger than a lower limit determination value THmin corresponding to a second threshold (Step S93). Further, it is determined whether or not a difference (Hd-Ld) between the maximum value Hd and the minimum value Ld is larger than a predetermined determination value THa (Step S94). When the sensor amplification factor is appropriate for each of the determinations in Steps S92 to S94, the sensor amplification factor is used as the amplification factor to be used to detect the peeling of the sheet leading end portion, and appropriate sensor amplification factor determination processing is ended. When the amplification factor does not satisfy determination in any one of Steps S92 to S94, the sensor amplification factor is rejected, the maximum value Hd and the minimum value Ld among the output values after the amplification with another sensor amplification factor are extracted (Step S95), and the processing returns again to Step S92. When all the sensor amplification factors do not satisfy determinations in Steps S92 to S94, error display is performed through outputting of the error display or the like. Thus, on the basis of the maximum value Hd and the minimum value Ld among the output values after the amplification during one rotation of the roll acquired along the flow chart in FIG. 9, the sensor amplification factor determination processing is performed to determine the amplification factor to be used to detect the peeling of the sheet leading end. In other words, the processing in FIGS. 9 and 10 described heretofore corresponds to an amplification factor adjustment operation for a peeling detecting unit including the sensor unit 6 to determine the sensor amplification factor to be used to detect the peeling of the sheet leading end.

FIG. 11A is an outline diagram of output waveforms each obtained by plotting each of the output values after the amplification obtained according to the flow chart in FIG. 9 at each of the rotation angles of the roll R. In the present embodiment, the output waveforms obtained from the sensor output values corresponding to the plurality of respective sensor amplification factors acquired in the flow chart in FIG. 9 are used as the sub-data sets for determining the sensor amplification factor in the flow chart in FIG. 10. The individual output values plotted in FIG. 11A correspond to a part of the sub-data sets. In this figure, it is assumed that the initial value of the sensor amplification factor described above is the amplification factor 4, and the upper limit value of the sensor amplification factor is the amplification factor 1. Since the roll R is rotated every time the sensor output value is acquired, the sensor output value obtained at each of the rotation angles is one. Even when the distance between the roll R and the sensor is invariable, the output value varies as the sensor amplification factor varies.

FIG. 11B illustrates positional relationships with determination values in the processing performed in the flow chart in FIG. 10. In FIG. 11B, all the output waveforms obtained by plotting the sensor output values at each of the rotation angles of the roll R are data including sensor output values acquired at different rotation angles, while the roll R was rotated once and the sensor amplification factor was varied, to determine the sensor amplification factor. The output waveforms corresponding to the plurality of amplification factors obtained by connecting, with lines, the sensor output values for the individual amplification factors plotted in FIG. 11A correspond to the sub-data sets corresponding to the plurality of respective sensor amplification factors. With the amplification factor 1 in FIG. 11B, the maximum value Hd exceeds the upper limit determination value THmax, and therefore Step S92 is not satisfied. With the amplification factor 4, the minimum value Ld is lower than the lower limit determination value THmin, and therefore Step S93 is not satisfied. With the amplification factors 2 and 3, the maximum value Hd is smaller than the upper limit determination value and the minimum value Ld is larger than the lower limit determination value, and therefore, as long as the difference (Hd-Ld) between the maximum value and the minimum value is larger than the determination value THa, each of the amplification factors 2 and 3 serves as the appropriate sensor amplification factor.

Second Embodiment

Figure 12:
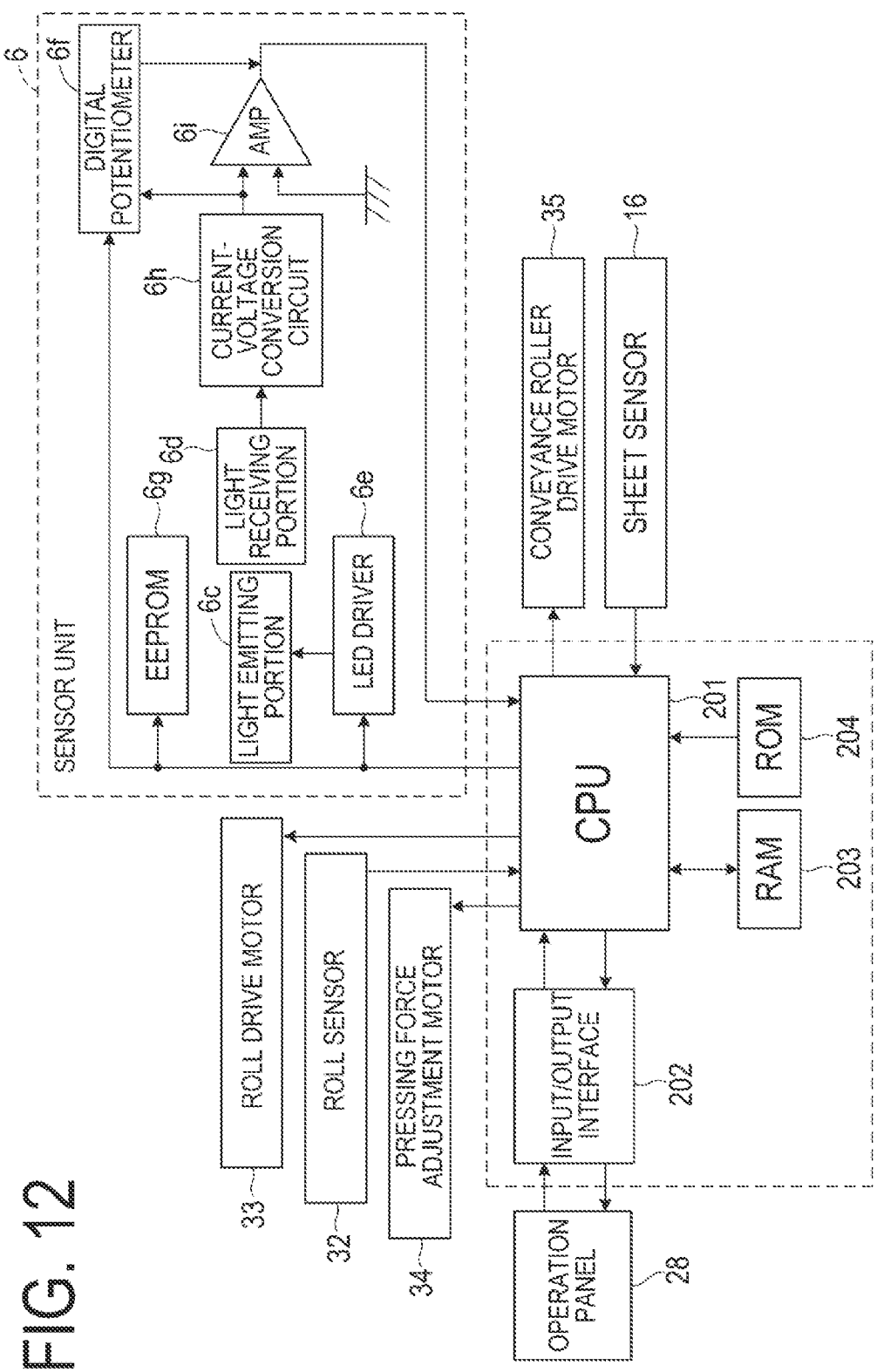
FIG. 12 is a block diagram of a control system in a printing apparatus in the second embodiment.
Figure 13:
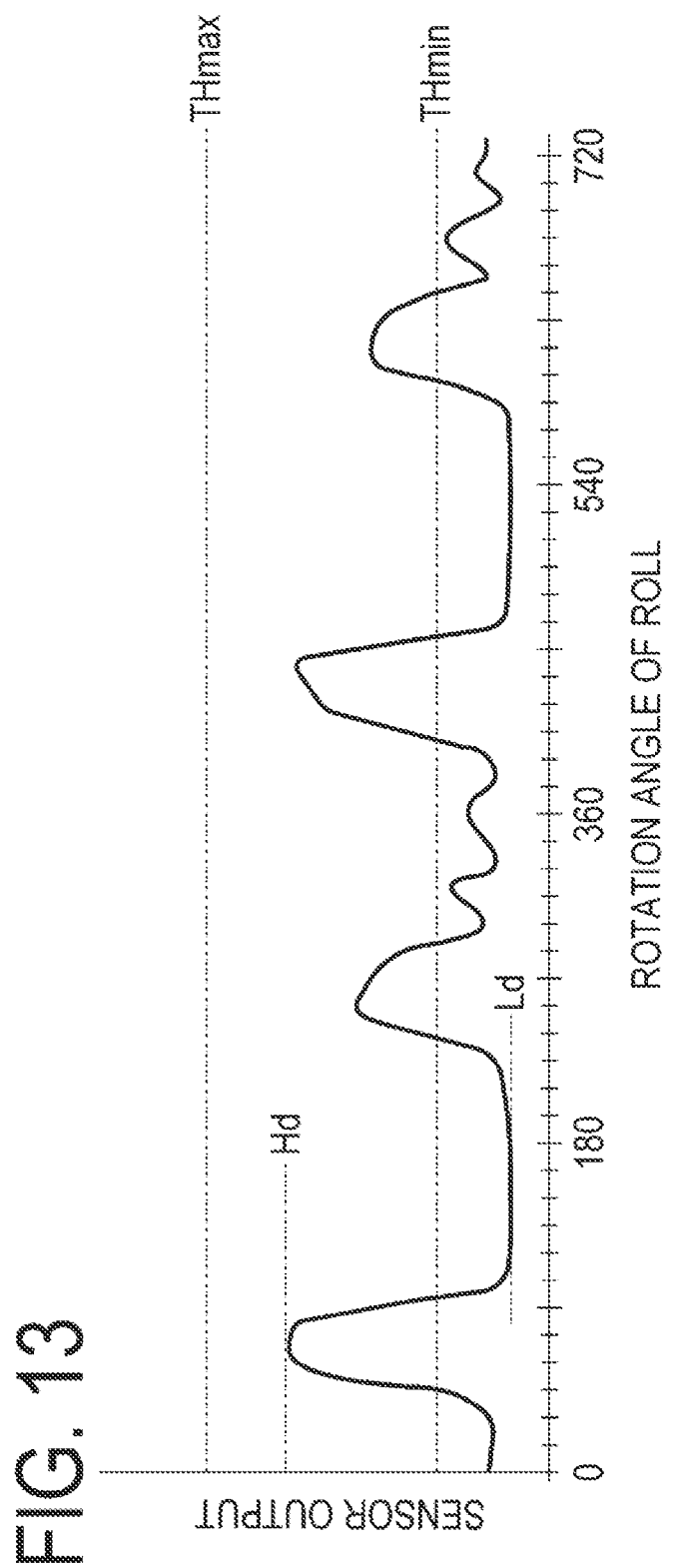
FIG. 13 is an illustrative view of the sensor output of the sensor unit.

FIGS. 12 and 13 are diagrams illustrating the second embodiment of the present invention. FIG. 12 is a block diagram of a control system in the second embodiment of the present invention. In the same manner as in the first embodiment described above, the sensor unit 6 includes an optical sensor having an output changing according to the facing gap with the surface of the roll R. In the present embodiment also, in the same manner as in the first embodiment, the light emitting portion 6c of the LED is connected to an LED driver 6e with a dimming function under the control of the CPU 201. By adjusting a current allowed to flow in the light emitting portion 6c, it is possible to change an amplification factor for the emission intensity of the light emitting portion 6c. The light receiving portion 6d of the photodiode is connected to a current-voltage conversion circuit 6h and to an amplification circuit 6i. By adjusting a resistance value of a digital potential meter 6f under the control of the CPU 201, it is possible to change an amplification factor for the photosensitivity of the light receiving portion 6d. In addition, the sensor unit 6 includes the EEPROM 6g as the nonvolatile memory for storing the amplification factors of the sensor (the amplification factor for the emission intensity of the light emitting portion 6c and the amplification factor for the photosensitivity of the light receiving portion 6d) after adjustment with the set roll, the number of roll settings at that time, and the like.

FIG. 13 is an illustrative view of the output waveform from the sensor unit 6 when the roll R is reversely rotated in the C2 direction. When the maximum value Hd of the sensor output of the sensor unit 6 becomes larger than the upper limit determination value THmax, the sensor output may have been saturated. When the minimum value Ld of the sensor output of the sensor unit 6 becomes smaller than the lower limit determination value THmin, a sensitivity of the sensor unit 6 may not be sufficient. When the difference between the maximum value Hd and the minimum value Ld is less than a predetermined value, it may be possible that the sensor output is affected by steady noise, and the detection of the position of the leading end portion of the sheet 1 becomes difficult. Accordingly, a determination value for determining whether or not the difference between the maximum value Hd and the minimum value Ld is sufficient is also set.

In the present embodiment, at an initial stage of the same sheet leading end setting processing (automatic loading) as that in the embodiment previously described, the roll R is reversely rotated, and the amplification factor of the sensor unit 6 is adjusted on the basis of an output (sensor output) of the detecting signal from the sensor unit 6 at that time.

Figure 14:
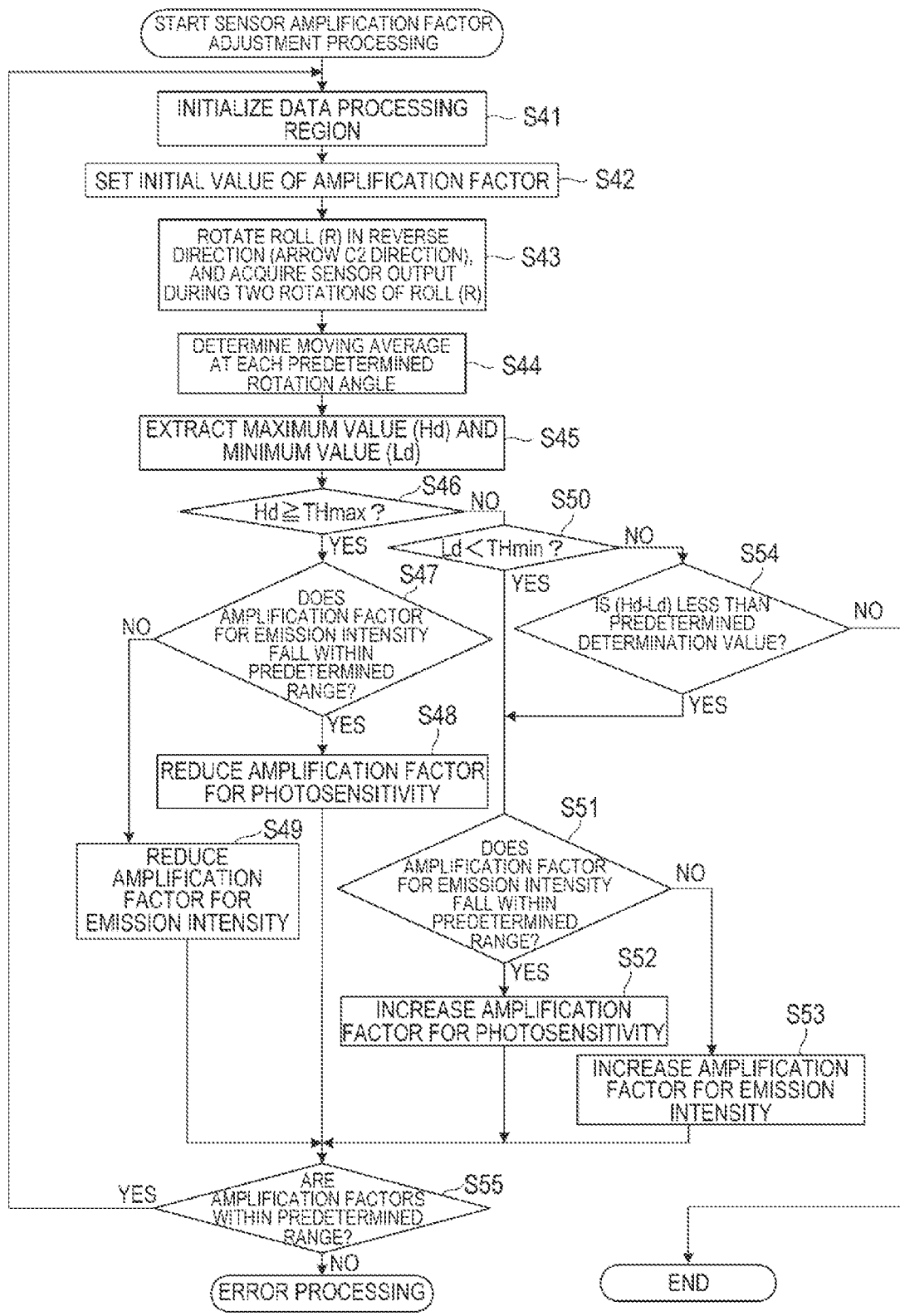
FIG. 14 is a flow chart for illustrating sensor amplification factor adjustment processing.

FIG. 14 is a flow chart for illustrating amplification factor adjustment processing for adjusting the amplification factor of the sensor unit 6 (sensor amplification factor).

First, the CPU 201 initializes the data processing region to ensure the region for processing the output data from the sensor unit 6 (Step S41), and then sets the initial value of the amplification factor of the sensor (Step S42). The amplification factor of the sensor adjusted by previous amplification factor adjustment processing is stored in the EEPROM 6g, and the stored amplification factor is set as the initial value. When no amplification factor is stored, a predetermined amplification factor is set as the initial value. In that case, the initial value of the amplification factor may also be set depending on a type, a roll diameter, or a width of the roll R input in advance using the operation panel 28. The roll diameter and width of the roll R may be set in the printing apparatus main body, or may also be set by a driver in a terminal wiredly or wirelessly connected to the printing apparatus, such as a personal computer. It may also be possible to include a temperature/humidity sensor, and set the initial value of the amplification factor depending on an ambient temperature and an ambient humidity when the roll R is set.

Then, the CPU 201 rotates the roll R one or more times in the arrow C2 direction, acquires the sensor output at that time as an output value after amplification by the sensor (Step S43), and determines a moving average value at each predetermined rotation angle of the roll R (Step S44). In the case of the present embodiment, the CPU 201 acquires the sensor outputs during two rotations of the roll R as output values after the amplification by the sensor, and determines the moving average value at each predetermined rotation angle of the roll R. In other words, in the present embodiment, the CPU 201 uses all the sensor outputs when the roll R is rotated twice as data for determining the amplification factor of the sensor described above, and acquires the sub-data sets corresponding to the amplification factor of the sensor from the individual sensor outputs. Then, using the moving average value determined from the sub-data sets, the CPU 201 extracts the maximum value Hd and the minimum value Ld (Step S45), and determines whether or not the maximum value Hd is equal to or more than the upper limit determination value THmax corresponding to the first threshold in FIG. 13 (Step S46). When the maximum value Hd is equal to or more than the upper limit determination value THmax, the CPU 201 determines whether or not the amplification factor for the emission intensity of the light emitting portion 6c falls within a predetermined range (first allowable range) (Step S47). Then, when the amplification factor for the emission intensity of the light emitting portion 6c falls within the predetermined range, the CPU 201 reduces the amplification factor for the photosensitivity of the light receiving portion 6d (Step S48) while, when the amplification factor for the emission intensity of the light emitting portion 6c falls outside the predetermined range, the CPU 201 reduces the amplification factor for the emission intensity of the light emitting portion 6c (Step S49). This allows a situation in which the sensor output is saturated to be avoided.

Meanwhile, when the maximum value Hd is less than the upper limit determination value THmax, the CPU 201 determines whether or not the minimum value Ld is less than the lower limit determination value THmin corresponding to the second threshold (Step S20). When the minimum value Ld is less than the lower limit determination value THmin, the CPU 201 determines whether or not the amplification factor for the emission intensity of the light emitting portion 6c falls within a predetermined range (Step SM). Then, when the amplification factor for the emission intensity of the light emitting portion 6c falls within the predetermined range, the CPU 201 increases the amplification factor for the photosensitivity of the light receiving portion 6d (Step S52) while, when the amplification factor for the emission intensity of the light emitting portion 6c falls outside the predetermined range, the CPU 201 increases the amplification factor for the emission intensity of the light emitting portion 6c (Step S53). Thus, it is possible to increase a detection sensitivity of the sensor unit 6.

Meanwhile, when the minimum value Ld is equal to or more than the lower limit determination value THmin, the CPU 201 determines whether or not the difference (Hd-Ld) between the maximum value Hd and the minimum value Ld is less than a predetermined determination value (Step S51). When the difference (Hd-Ld) is less than the predetermined determination value, it may be possible that the sensor output is affected by steady noise, and the detection of the position of the leading end portion of the sheet 1 becomes difficult. In this case, to increase the amplification factor for the emission intensity or photosensitivity of the sensor unit 6, the processing moves from Step S4 to Step S51. When the difference (Hd-Ld) is equal to or more than the predetermined determination value, the CPU 201 determines that the amplification factors for the emission intensity and photosensitivity of the sensor unit 6 have appropriately been adjusted, and ends the amplification factor adjustment processing.

After adjusting either one of the amplification factors for the emission intensity and the photosensitivity in previous Steps S48, S49, S52, and S53, the CPU 201 determines whether or not these amplification factors are amplification factors within the predetermined ranges (Step S55). In other words, the CPU 201 determines whether or not the emission intensity falls within the predetermined range (first allowable range) and whether or not the photosensitivity falls within the predetermined range (second allowable range). When both of the amplification factors for the emission intensity and the photosensitivity fall within the predetermined ranges, the CPU 201 returns to previous Step S41 to check again whether or not those amplification factors are appropriate. When the amplification factors for the emission intensity and the photosensitivity are not the amplification factors within the predetermined ranges, the CPU 201 determines that the amplification factors have exceeded an adjustment limit, and performs error processing through outputting of the error display or the like. When the amplification factors for the emission intensity and the photosensitivity are the amplification factors within the predetermined ranges, the CPU 201 may also count the number of times those amplification factors are increased and reduced in Steps S48, S49, S52, and S53, and perform the error processing when the count value is equal to or more than a given number.

Figure 15:
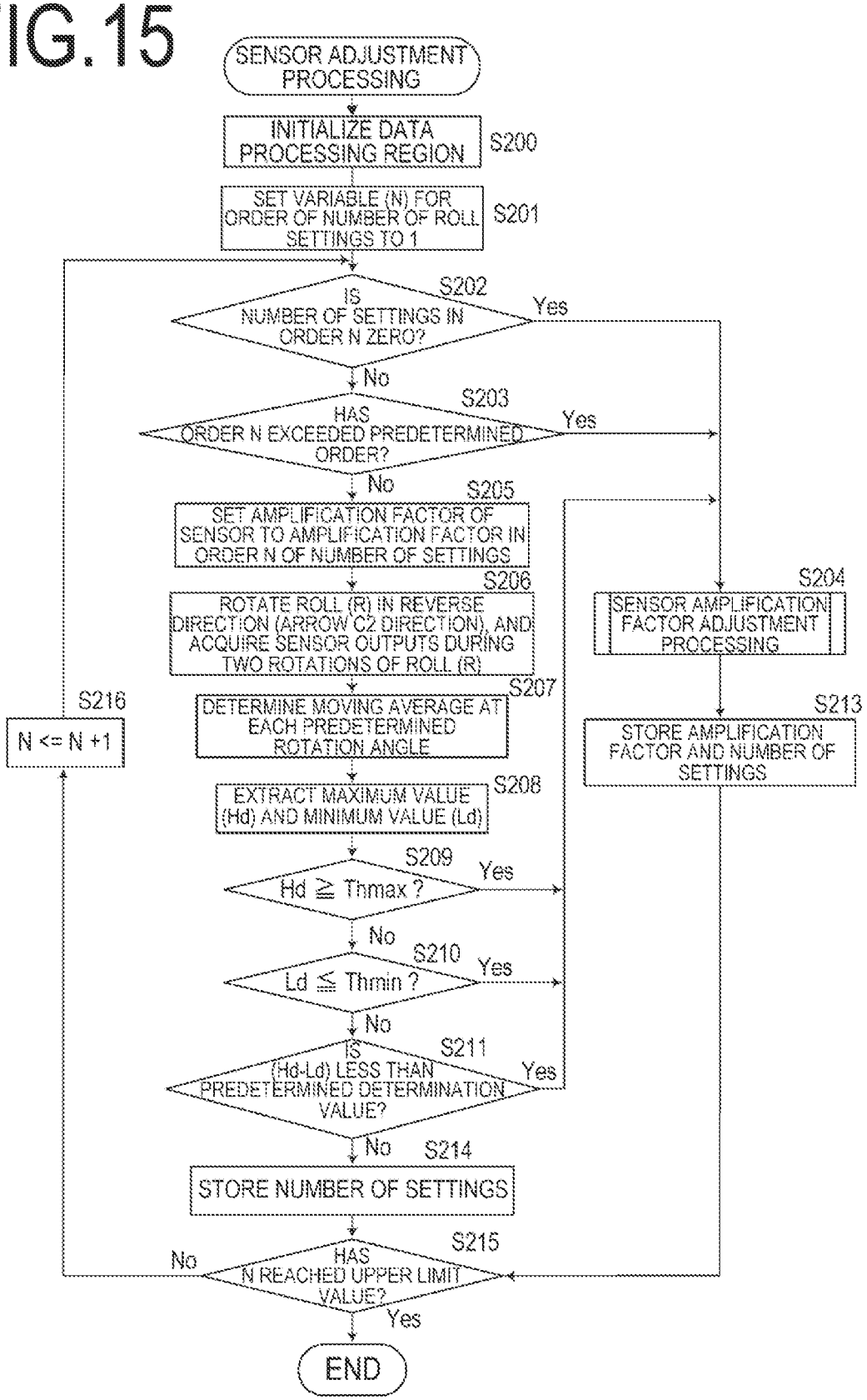
FIG. 15 is a flow chart of the sensor amplification factor adjustment processing in the second embodiment.

FIG. 15 is a flow chart for illustrating amplification factor adjustment processing for the sensor unit 6 by using a history of the number of roll settings and the sensor amplification factors at an initial stage of the leading end setting processing (automatic loading).

FIG. 16 is a diagram illustrating a memory space in which the numbers of roll settings and the amplification factors are to be stored in the present embodiment. The sheet feeding devices 200 in the present embodiment are configured such that different types of the rolls R can be set in the two upper and lower roll holding portions, as illustrated in FIG. 2. Accordingly, to change the sheet to be fed to the printing portion according to a use purpose, it is possible to select one of the upper and lower roll holding portions from which the sheet is to be fed or replace the rolls R set in the roll holding portions. Then, in a space of the nonvolatile memory (EEPROM 6g) serving as a storage unit in FIG. 12, a rolled sheet name representing a type of a rolled sheet, such as a material of the sheet 1, the amplification factor of the sensor set for each rolled sheet, and the number of settings of the rolled sheet in the roll holding portions of the sheet feeding devices 200 are saved and stored as a set of history information. The nonvolatile memory (EEPROM 6g) has individual memories in the two upper and lower feeding devices 200.

After the rolls are replaced, first, the CPU 201 initializes the data processing region to ensure the region for processing the output data from the sensor unit 6 (Step S200). Then, the CPU 201 sets a variable (N) for the order of the number of roll settings to 1 so as to examine, in the history information stored in the EEPROM 6g, the sensor amplification factor set to the roll having the largest number of roll settings (Step S201).

Then, the CPU 201 checks whether or not the number of settings of the roll having the largest number of settings saved in the EEPROM 6g as the nonvolatile memory is zero (Step S202). When the number of settings is zero, the CPU 201 determines that there is no history of roll setting, and performs the amplification factor adjustment processing for adjusting the amplification factor of the sensor illustrated in FIG. 14 (Step S204). When the number of settings is not zero, the CPU 201 determines that there is a history of roll settings and further determines whether or not the variable (N) for the order of the number of settings has exceeded a predetermined order (Step S203). When the variable for the order of the number of settings has not exceeded the predetermined order, i.e., when determining that the number of settings of the roll for which the variable N for the order of the number of settings described above is set to 1 is equal to or less than a predetermined number, the CPU 201 sets the amplification factor in the order of the saved number of settings as the amplification factor (adjusted amplification factor) of the sensor (Step S205). When the variable for the order of the number of settings has exceeded the predetermined order, i.e., when determining that the number of settings of the roll for which the variable N for the order of the number of settings described above is set to 1 has exceeded the predetermined number, the CPU 201 determines that a state of a sheet formed into the roll has changed due to sheet feeding from the roll having been performed a large number of times and that the sensor amplification factor stored in the EEPROM 6g does not correspond to the roll. Then, the CPU 201 performs again the amplification factor adjustment processing for adjusting the amplification factor of the sensor illustrated in FIG. 14 (Step S204). Note that, to identify whether or not the number of roll settings is zero, when the roll is set in the roll holding portion, the user inputs, from the operation panel 28 serving as an input unit, information for identifying the roll such as the rolled sheet name of the set roll. As a result, since the rolled sheet name is associated with the sensor amplification factor stored in the EEPROM 6g, when the set roll is the same as the previously set roll, by cross-checking the rolled sheet name and the sensor amplification factor corresponding thereto, it is possible to determine whether or not there is a history of setting of the roll. When the set roll is the roll that has never been set, the rolled sheet name and the sensor amplification factor corresponding thereto are not stored in the EEPROM 6g, and therefore it is possible to determine that there is no history of setting of the roll.

When the amplification factor saved in the roll setting history is set as the adjusted amplification factor, the CPU 201 rotates the roll R in the arrow C2 direction twice, and acquires the sensor outputs at that time, i.e., the output values after amplification with the sensor amplification factor (step S206). Then, the CPU 201 determines, from the sensor outputs, a moving average at each predetermined rotation angle of the roll R (Step S207). In the case of the present embodiment, the sensor outputs corresponding to two rotations of the roll R are acquired, and the moving average is determined at each predetermined rotation angle of the roll R. The CPU 201 extracts the maximum value Hd and the minimum value Ld of the moving average data, and calculates the difference (Hd-Ld) between the maximum value Hd and the minimum value Ld (Step S208).

When the maximum value Hd is smaller than the upper limit determination value THmax corresponding to the first threshold, the minimum value Ld is larger than the lower limit determination value THmin corresponding to the second threshold, and the difference (Hd-Ld) between the maximum value Hd and the minimum value Ld is equal to or more than the predetermined determination value, the CPU 201 determines that the adjusted amplification factor is an appropriate amplification factor having an appropriate value (Steps S209 to S211). Then, the CPU 201 counts up the number of settings to update the history (Step S214).

Meanwhile, when the maximum value Hd is equal to or more than the upper limit determination value THmax, the minimum value Ld is equal to or less than the lower limit determination value THmin, and the difference (Hd-Ld) between the maximum value Hd and the minimum value Ld is less than the predetermined determination value, the CPU 201 determines that the amplification factor of the sensor does not have the appropriate value (Steps S209 to S211).

When determining that the amplification factor does not have the appropriate value, the CPU 201 performs the amplification factor adjustment processing for adjusting the amplification factor of the sensor to determine again the amplification factor of the sensor (Step S204), and saves the adjusted amplification factor and the number of roll settings in the EEPROM 6g (Step S213). Then, the CPU 201 checks whether or not the variable N for the order of the number of settings has reached an upper limit value, i.e., whether or not there are any more rolls for which the sensor amplification factors are to be examined (Step S215). When N has reached the upper limit value and there are no more rolls for which the amplification factors are to be examined, the CPU 201 ends the sensor adjustment processing. When N has not reached the upper limit value and there is still a roll for which the amplification factor is to be examined, the CPU 201 counts up the variable (N) for the order of the number of settings so as to set the amplification factor of the rolled sheet having the second largest number of settings (Step S216).

Then, the processing returns to Step S202 in which the CPU 201 examines, in the saved roll setting history (FIG. 16), whether or not the number of settings of the rolled sheet having the next largest number of settings is zero (Step S202) or whether or not the variable (N) for the order of the number of settings has exceeded the predetermined order (Step S203). Then, the CPU 201 sets the amplification factor saved in the order of the number settings (Step S205), and performs the same step as that performed in the case of the rolled sheet having the largest number of settings. First, the CPU 201 rotates the roll in the arrow C2 direction, and acquires the sensor output as the output value after amplification with the sensor amplification factor. Then, the CPU 201 examines whether or not the maximum value Hd is smaller than the upper limit determination value THmax, whether or not the minimum value Ld is larger than the lower limit determination value THmin, and whether or not the difference (Hd-Ld) between the maximum value Hd and the minimum value Ld is equal to or more than the predetermined determination value (Steps S206 to Step S211). Then, when these conditions are satisfied, the CPU 201 determines that the amplification factor in the order of the number of settings at that time has the appropriate value, and counts up the number of settings to update the history (Step S214). When the maximum value Hd is equal to or more than the upper limit determination value THmax, the minimum value is equal to or less than the lower limit determination value THmin, and the difference (Hd-Ld) between the maximum value Hd and the minimum value Ld is less than the predetermined determination value, the CPU 201 adjusts the amplification factor of the sensor in the sensor amplification factor adjustment processing (Step S204).

Thus, the sensor amplification factors stored in the EEPROM 6g are sequentially examined for each of the rolls. Then, when determining that the sensor amplification factor has the appropriate value in Steps S209 to S211, the CPU 201 counts up the number of settings in the order (N) of the number of settings at that time to update the roll setting history in FIG. 16 (Step S214). Then, the CPU 201 performs the amplification factor adjustment processing and the determination processing each described above until the variable (N) for the order of the number of settings reaches the upper limit value, i.e., until there are no more rolls for which the sensor amplification factors are to be examined.

Note that, when the adjustment of the amplification factor of the sensor is ended in the sensor amplification factor adjustment processing (Step S204) performed in a case where the number of roll settings is zero, where the order of the number of settings has exceeded the predetermined order, or where it is determined that the sensor amplification factor set to the roll does not have the appropriate value, the CPU 201 determines whether or not there are amplification factors having values equal to the values of the amplification factors saved in the memory space of the roll setting history. When such amplification factors are present, the CPU 201 counts up the number of settings. When such amplification factors are not present, the CPU 201 sets the number of settings to 1, updates the roll setting history, and saves the roll setting history in the EEPROM 6g as the nonvolatile memory (Step S213). Note that, as the sensor amplification factor adjustment processing and the determining processing for whether or not the sensor amplification factor has the appropriate value in the present embodiment, the amplification factor adjustment processing and the determination processing in the first embodiment may also be performed.

The predetermined order in which the roll setting history in Step S203 is to be used can be changed by using the operation panel 28. Accordingly, the adjustment of the sensor after replacement of the rolled sheet is started by using, as an initial value, a value of the sensor amplification factor of the rolled sheet that is largest in the number of settings, and is performed in order of the rolled sheets that are larger in the number of settings until the acquired sensor output has a predetermined waveform. Then, the adjustment of the sensor is repeated, while the saved value of the sensor amplification factor is changed. The value of the sensor amplification factor thus adjusted is stored in the EEPROM 6g for each of the rolls and, when the sheet is fed, the sensor is adjusted by reading the sensor amplification factor corresponding to the roll from the EEPROM 6g. This can reduce the time required for the sensor adjustment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No.

What is claimed is:

1. A sheet feeding device comprising:
    a holding portion that holds a roll formed of a wound sheet;
    a drive unit that rotates the roll held by the holding portion in a first direction in which the sheet is fed out into a conveyance path and in a second direction which is reverse to the first direction;
    a sensor that outputs an output value according to a distance between a detecting position facing a peripheral surface of the roll and the peripheral surface of the roll;
    an amplification circuit configured to amplify the output value from the sensor; and
    a control unit that changes an amplification factor of the amplification circuit for each of predetermined angles while the roll is rotated by the drive unit one rotation in the second direction and acquires data of output values including the output value corresponding to each amplification factor,
    wherein a plurality of amplification factors include at least a first amplification factor and a second amplification factor,
    wherein a plurality of sub-data sets corresponding to the plurality of the amplification factors, respectively, including a first sub-data set and a second sub-data set corresponding to the first amplification factor and the second amplification factor, respectively, are extracted from the data, and
    wherein the control unit determines the amplification factor to be used on the basis of the plurality of sub-data sets.

2. The sheet feeding device according to claim 1, wherein the control unit determines the amplification factor to be used on the basis of a maximum value and a minimum value which correspond to each of the plurality of sub-data sets.

3. The sheet feeding device according to claim 2, wherein the control unit determines, as the amplification factor to be used, the value of the amplification factor included in the plurality of amplification factors, and having the maximum value lower than a first threshold, and having the minimum value higher than a second threshold lower than the first threshold, and moreover having a difference between the maximum value and the minimum value which is higher than a predetermined determination value.

4. The sheet feeding device according to claim 1, wherein the data is data when the roll is rotated at least twice for each of the plurality of amplification factors.

5. The sheet feeding device according to claim 4, wherein the control unit acquires a moving average value of the sub-data sets for each of the plurality of amplification factors, and determines the amplification factor to be used on the basis of a maximum value and a minimum value of the moving average value.

6. The sheet feeding device according to claim 1, wherein the sensor is an optical sensor including a light emitting portion and a light receiving portion, and wherein the amplification factor changes a photosensitivity of the light receiving portion.

7. The sheet feeding device according to claim 1, wherein the holding portion is configured to allow a different roll to be replaceably set, and wherein the sheet feeding device further comprises:
    an input unit to which information for identifying the roll set in the sheet feeding device is input; and
    a storage unit that stores history information including the amplification factor and a number of settings for each roll.

8. The sheet feeding device according to claim 7, wherein, in a case where the number of settings of the roll set in the device is zero and in a case where the number of settings of the roll set in the device has exceeded a predetermined number, the control unit determines the amplification factor to be used on the basis of the data and causes the storage unit to store the determined amplification factor.

9. The sheet feeding device according to claim 7, wherein, in a case where the number of settings of the roll set in the device is equal to or less than a predetermined number and in a case where the storage unit stores the amplification factor, the control unit determines whether or not the amplification factor stored in the storage unit is an appropriate amplification factor, determines again the amplification factor on the basis of the data in a case where the stored amplification factor is not the appropriate amplification factor, and causes the storage unit to store the determined amplification factor.

10. A printing apparatus comprising:
the sheet feeding device according to claim 1; and
a printing portion that prints an image on a sheet fed from the sheet feeding device.

* * * * *